(12) United States Patent
Maenishi

(10) Patent No.: US 8,079,140 B2
(45) Date of Patent: Dec. 20, 2011

(54) COMPONENT MOUNTING CONDITION DETERMINING METHOD

(75) Inventor: Yasuhiro Maenishi, Saga (JP)

(73) Assignee: Panasonic Corporation, Osaka (JP)

( * ) Notice: Subject to any disclaimer, the term of this patent is extended or adjusted under 35 U.S.C. 154(b) by 338 days.

(21) Appl. No.: 12/294,504

(22) PCT Filed: Jul. 24, 2007

(86) PCT No.: PCT/JP2007/064840
§ 371 (c)(1),
(2), (4) Date: Sep. 25, 2008

(87) PCT Pub. No.: WO2008/015988
PCT Pub. Date: Feb. 7, 2008

(65) Prior Publication Data
US 2010/0223782 A1    Sep. 9, 2010

(30) Foreign Application Priority Data

Jul. 31, 2006 (JP) .................. 2006-208814

(51) Int. Cl.
*H05K 3/30* (2006.01)
*H05K 3/20* (2006.01)
(52) U.S. Cl. ............... 29/832; 29/833; 29/831
(58) Field of Classification Search .......... 29/832, 29/830, 831, 833, 834, 739, 740, 741, 742, 29/743
See application file for complete search history.

(56) References Cited

U.S. PATENT DOCUMENTS

| 6,918,176 | B2 * | 7/2005 | Nagao et al. | 29/832 |
| 7,003,872 | B2 * | 2/2006 | Mimura et al. | 29/832 |
| 7,017,263 | B2 * | 3/2006 | Yanagida | 29/833 |
| 7,246,429 | B2 * | 7/2007 | Oyama | 29/740 |
| 7,356,919 | B2 * | 4/2008 | Hata et al. | 29/833 |
| 7,739,077 | B2 * | 6/2010 | Maenishi | 702/182 |
| 7,890,204 | B2 * | 2/2011 | Maenishi | 700/121 |
| 7,899,561 | B2 * | 3/2011 | Maenishi et al. | 700/28 |
| 7,954,233 | B2 * | 6/2011 | Maenishi | 29/832 |
| 2002/0069524 | A1 * | 6/2002 | Kawashima | 29/832 |

(Continued)

FOREIGN PATENT DOCUMENTS

EP    1 009 211    6/2000

(Continued)

OTHER PUBLICATIONS

Sun et al, "Component allocation and feeder arrangemnet for a dual-gantry multi-head surface mounting placement tool," International Journal of Production Economics, Elsevier, Amsterdam, NL, vol. 95, No. 2, Feb. 18, 2005, pp. 245-264, XP004714281 ISSN: 0925-5273.*

(Continued)

*Primary Examiner* — David Angwin
(74) *Attorney, Agent, or Firm* — Wenderoth, Lind & Ponack, L.L.P.

(57) ABSTRACT

In a component mounter of so-called alternate mounting, a component mounting condition determining method of determining a component mounting condition that equalizes operating times of a plurality of mounting heads is used. The component mounting condition determining method includes determining a component mounting condition such as to approximately equalize the operating times of the mounting heads based on the distance that each mounting head moves between one of a plurality of component supply units that supply components to the mounting heads and the board.

8 Claims, 29 Drawing Sheets

U.S. PATENT DOCUMENTS

| | | | |
|---|---|---|---|
| 2002/0138977 A1* | 10/2002 | Nagao et al. | 29/832 |
| 2002/0148108 A1* | 10/2002 | Seto et al. | 29/743 |
| 2004/0139602 A1* | 7/2004 | Saho | 29/832 |
| 2004/0211059 A1* | 10/2004 | Kim et al. | 29/832 |
| 2005/0125998 A1* | 6/2005 | Mimura et al. | 29/832 |
| 2005/0132565 A1* | 6/2005 | Aoki et al. | 29/743 |
| 2005/0210664 A1* | 9/2005 | Kitajima et al. | 29/739 |
| 2006/0185157 A1* | 8/2006 | Shida et al. | 29/740 |
| 2006/0200975 A1* | 9/2006 | Hata et al. | 29/743 |
| 2007/0011869 A1* | 1/2007 | Watanabe et al. | 29/739 |
| 2007/0101572 A1* | 5/2007 | Kabeshita et al. | 29/832 |
| 2007/0157462 A1* | 7/2007 | Nakamura | 29/832 |
| 2008/0154392 A1* | 6/2008 | Maenishi et al. | 700/32 |
| 2008/0263858 A1* | 10/2008 | Onishi | 29/743 |
| 2009/0100672 A1* | 4/2009 | Sumi et al. | 29/832 |
| 2009/0119912 A1* | 5/2009 | Watanabe et al. | 29/832 |
| 2009/0241327 A1* | 10/2009 | Kashitani et al. | 29/739 |
| 2010/0064511 A1* | 3/2010 | Maenishi | 29/832 |

FOREIGN PATENT DOCUMENTS

| | | |
|---|---|---|
| JP | 2002-299889 | 10/2002 |
| JP | 2004-186391 | 7/2004 |

OTHER PUBLICATIONS

International Search Report issued Nov. 5, 2007 in the International (PCT) Application of which the present application is the U.S. National Stage.

Written Opinion of the International Searching Authority issued Nov. 5, 2007 in the International (PCT) Application of which the present application is the U.S. National Stage.

D. Sun et al., "Component allocation and feeder arrangement for a dual-gantry multi-head surface mounting placement tool," International Journal of Production Economics 95 (2005), pp. 245-264.

* cited by examiner

Mounting point pi = (component type Ci, X coordinate xi,
 Y coordinate yi, control data $\phi$i, mounting
 angle $\theta$i)

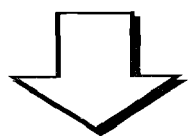
Mounting point data is list of mounting points pi $$\text{Mounting point data} = \begin{pmatrix} p1 \\ p2 \\ p3 \\ \cdot \\ \cdot \\ \cdot \\ pN \end{pmatrix} = \begin{pmatrix} c1, x1, y1, \phi 1, \theta 1 \\ c2, x2, y2, \phi 2, \theta 2 \\ c3, x3, y3, \phi 3, \theta 3 \\ \cdot \\ \cdot \\ \cdot \\ cN, xN, yN, \phi N, \theta N \end{pmatrix}$$

FIG. 7

| Component Name | (Component external appearance) | Component Size (mm) | | | Two-dimensional recognition method | Pickup nozzle | Tact (sec) | Maximum speed level |
|---|---|---|---|---|---|---|---|---|
| | | X | Y | L | | | | |
| 0603CR | | 0.6 | 0.3 | 0.25 | | SX | 0.086 | |
| 1005CR | | 1.0 | 0.5 | 0.3–0.5 | | SA | | |
| 1608CR | | 1.6 | 0.8 | 0.4–0.8 | | | 0.094 | |
| 2012CR | | 2.0 | 1.25 | 0.4–0.8 | | S | | |
| 3216CR | | 3.2 | 1.6 | 0.4–0.8 | | | | 1 |
| 4TR | | 2.8 | 2.8 | 1.1 | | | | |
| 6TR | | 4.3 | 4.5 | 1.5 | | | | |
| 1TIP | | 2.0 | φ1.0 | — | | Cylindrical chip | | |
| 2TIP | | 3.6 | φ1.4 | — | | | 0.11 | |
| 1CAP | | 3.8 | 1.9 | 1.6 | Reflection | S | | |
| 2CAP | | 4.7 | 2.6 | 2.1 | | | | |
| 3CAP | | 6.0 | 3.2 | 2.5 | | | | |
| 4CAP | | 7.3 | 4.3 | 2.8 | | M | | |
| SCAP | | 4.3 | 4.3 | 6.0 | | | | |
| LCAP | | 6.6 | 6.6 | 6.0 | | | | |
| LLCAP | | 10.3 | 10.3 | 10.5 | | ML | | |
| 1VOL | | 4.5 | 3.8 | 1.6–2.4 | | | | |
| 2VOL | | 3.7 | 3.0 | 1.6 | | M | 0.13 | 2 |
| 3VOL | | 4.8 | 4.0 | 3.0 | | | | |

| Component type | Number of components |
|---|---|
| A | 6 |
| B | 7 |
| C | 8 |
| D | 9 |
| E | 2 |
| Total | 32 |

FIG. 14A
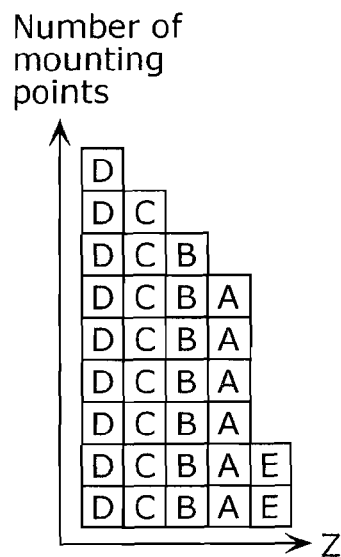
FIG. 14B
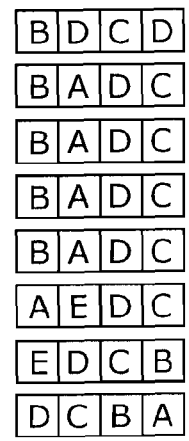
FIG. 14C   FIG. 14D   FIG. 14E   FIG. 14F
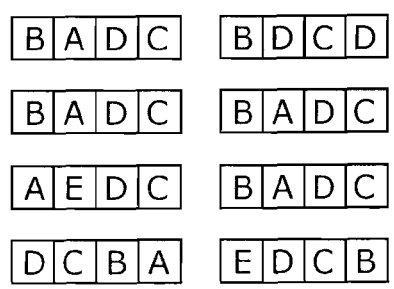
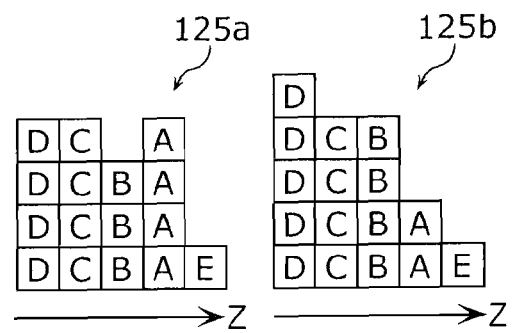

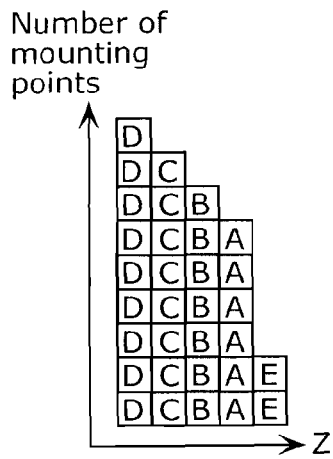
FIG. 16A
FIG. 16B
FIG. 16C
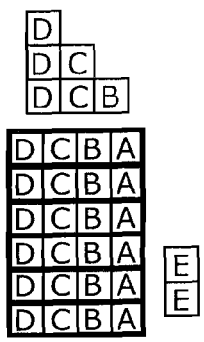
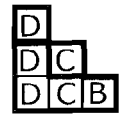
FIG. 16D
FIG. 16E
FIG. 16F
FIG. 16G
FIG. 16H
FIG. 16I
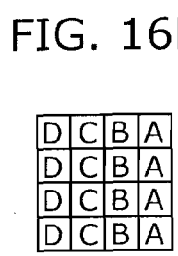
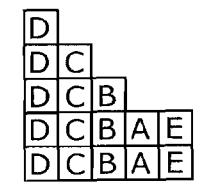
FIG. 16J
FIG. 16K

Number of mounting points

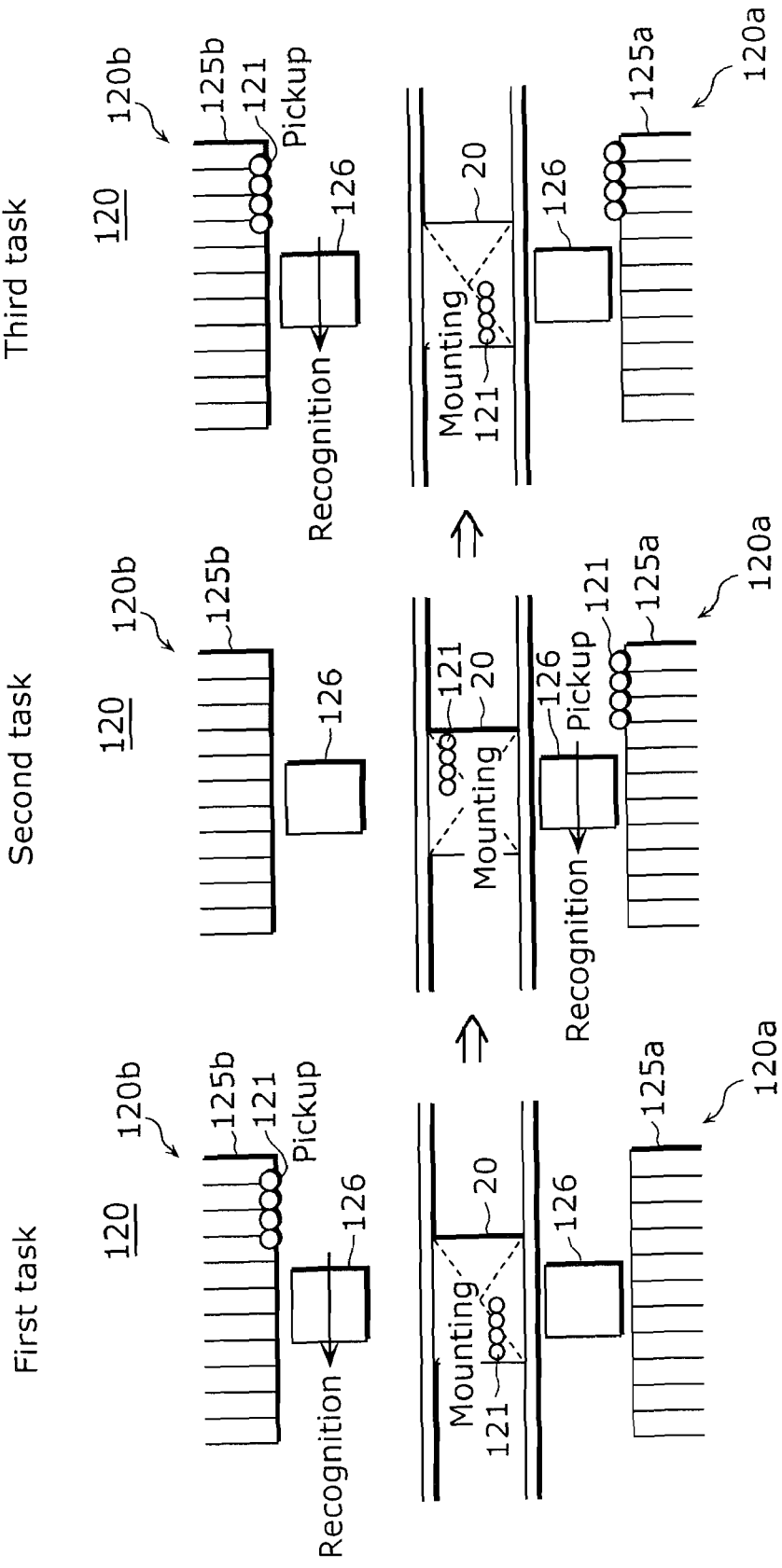

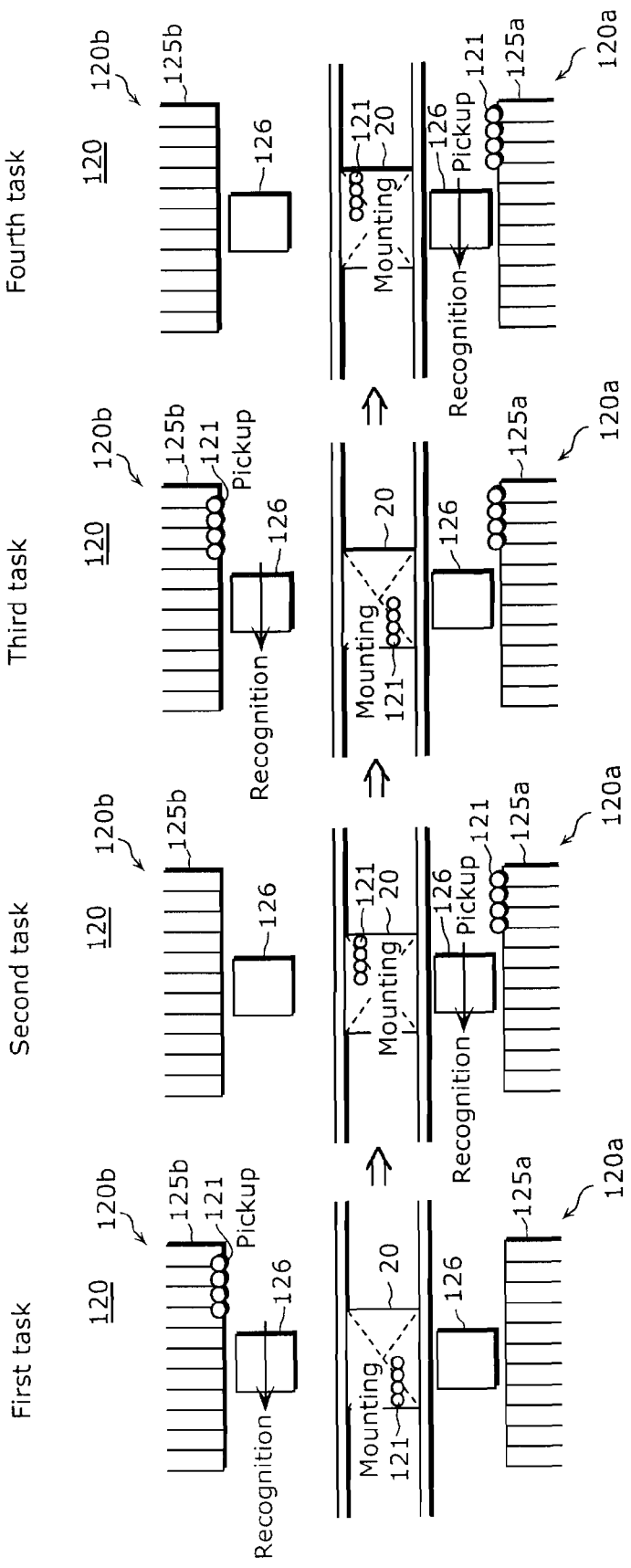

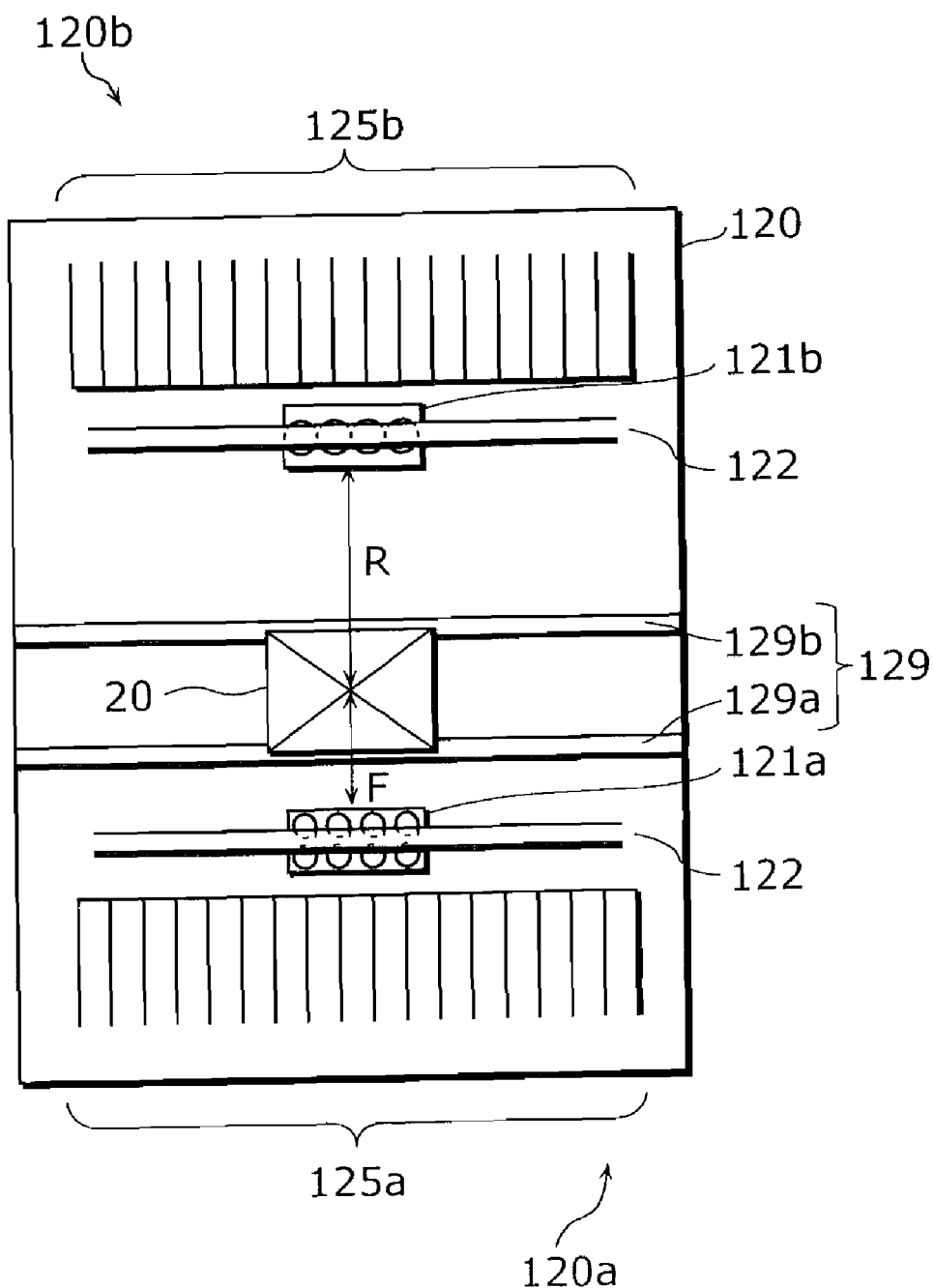

| 65 | 65 | 80 | 80 |
|----|----|----|----|
| 25 | 25 | 45 | 45 |
| 0  | 0  | 0  | 90 |
| 90 | 90 | 90 | 90 |
| 0  | 0  | 0  | 0  |
| 0  | 0  | 0  | 0  |

| 90 | 90 | 90 | 90 |
|----|----|----|----|
| 0  | 0  | 0  | 0  |
| 0  | 0  | 0  | 0  |

| 65 | 65 | 80 | 80 |
|----|----|----|----|
| 25 | 25 | 45 | 45 |
| 0  | 0  | 0  | 90 |

COMPONENT MOUNTING CONDITION DETERMINING METHOD

TECHNICAL FIELD

The present invention relates to a component mounting condition determining method and, in particular, to a component mounting condition determining method used for a component mounter in which a plurality of mounting heads alternately mount components onto one board.

BACKGROUND ART

Conventionally, a component mounter referred to as a component mounter of so-called alternate mounting is known in which two mounting heads alternately mount components onto one board in the form of coordinated operation.

As a determining method for a component mounting condition in such a component mounter of alternate mounting, one that has been proposed equalizes the number of components to be mounted for two mounting heads (see, for example, Japanese Unexamined Patent Application Publication No. 2004-186391).

SUMMARY OF THE INVENTION

However, when the conventional component mounting condition determining method is applied to a component mounter of alternate mounting in which mounting heads are provided at positions facing each other with a board in between, that is, at the front and rear of the board, a problem arises in some cases.

That is, in the conventional determining method for a component mounting condition, the numbers of components are equalized for the two mounting heads. Thus, when the distance from the mounting head on the front side to the board is equal to the distance from the mounting head on the rear side to the board, the operating time becomes approximately equal for the two mounting heads. However, the size of the board is different depending on the component mounting board to be produced. Thus, the distance from the mounting head on the front side to the board is not necessarily equal to the distance from the mounting head on the rear side to the board. Accordingly, when the two distances are different from each other, the moving time of a mounting head having the shorter distance to the board becomes short, while the moving time of the other mounting head becomes long. This causes a problem that the two operating times are not equal to each other.

The present invention has been conceived in order to solve the above-mentioned problem. Its object is to provide a component mounting condition determining method of determining a component mounting condition that equalizes the operating times for a plurality of mounting heads in a component mounter of so-called alternate mounting.

In order to achieve the above mentioned object, the component mounting condition determining method according to the present invention determines a component mounting condition used for a component mounter which includes a plurality of mounting heads that alternately mount components onto one board, the method including determining a component mounting condition so as to approximately equalize operating times among the mounting heads by reducing an operating time of one of the mounting heads which moves a longer distance between a component supply unit and the board. The operating time to be reduced is the time that the one of the mounting heads takes for an operation other than movement between the component supply unit and the board, and the component supply unit supplying the components.

A component mounting condition is determined based on the distances that the mounting heads move from the component supply unit to the board. This permits determination of a component mounting condition that equalizes the operating times of a plurality of mounting heads in a component mounter of so-called alternate mounting.

For example, in the determining, the component mounting condition is determined so as to reduce a length of time necessary for the one of the mounting heads which moves the longer distance between the component supply unit and the board to pick up the components from the component supply unit.

Further, in the determining, the component mounting condition is determined so as to increase the number of components which can be simultaneously picked up from the component supply unit by the one of the mounting heads which moves the longer distance between the component supply unit and the board.

Here, in addition to implementation as a component mounting condition determining method provided with such characteristic steps, the present invention may be implemented as a component mounting condition determining apparatus having means made up of the characteristic steps included in the component mounting condition determining method or alternatively as a program that causes a computer to execute the characteristic steps included in the component mounting condition determining method. Then, it goes without saying that such program may be distributed via a recording medium such as a Compact Disc-Read Only Memory (CD-ROM) and a communication network such as the Internet.

The present invention provides a component mounting condition determining method of determining a component mounting condition that equalizes the operating times of a plurality of mounting heads in a component mounter of so-called alternate mounting.

FURTHER INFORMATION ABOUT TECHNICAL BACKGROUND TO THIS APPLICATION

The disclosure of Japanese Patent Application No. 2006-208814 filed on Jul. 31, 2006 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the drawings:

FIG. 6 is a diagram showing an example of mounting point data;

FIG. 7 is a diagram showing an example of a component library;

FIG. 9 is a diagram showing an example of number-of-mounting-points information;

FIG. 14A is a diagram that describes processing shown in FIG. 13;

FIG. 14B is a diagram that describes processing shown in FIG. 13;

FIG. 14C is a diagram that describes processing shown in FIG. 13;

FIG. 14D is a diagram that describes processing shown in FIG. 13;

FIG. 14E is a diagram that describes processing shown in FIG. 13;

FIG. 14F is a diagram that describes processing shown in FIG. 13;

FIG. 16A is a diagram that describes processing shown in FIG. 15;

FIG. 16B is a diagram that describes processing shown in FIG. 15;

FIG. 16C is a diagram that describes processing shown in FIG. 15;

FIG. 16D is a diagram that describes processing shown in FIG. 15;

FIG. 16E is a diagram that describes processing shown in FIG. 15;

FIG. 16F is a diagram that describes processing shown in FIG. 15;

FIG. 16G is a diagram that describes processing shown in FIG. 15;

FIG. 16H is a diagram that describes processing shown in FIG. 15;

FIG. 16I is a diagram that describes processing shown in FIG. 15;

FIG. 16J is a diagram that describes processing shown in FIG. 15;

FIG. 16K is a diagram that describes processing shown in FIG. 15;

FIG. 19 is a diagram describing a mounting order in a case where the number of tasks is odd;

FIG. 20 is a diagram describing a mounting order in a case where the number of tasks is even;

FIG. 23 is a diagram describing arrangement of line gang pickup heads in a case where the line gang pickup heads have different numbers of pickup nozzles from each other;

DETAILED DESCRIPTION OF THE INVENTION

A component mounting system according to an embodiment of the present invention is described below.

Figure 1:
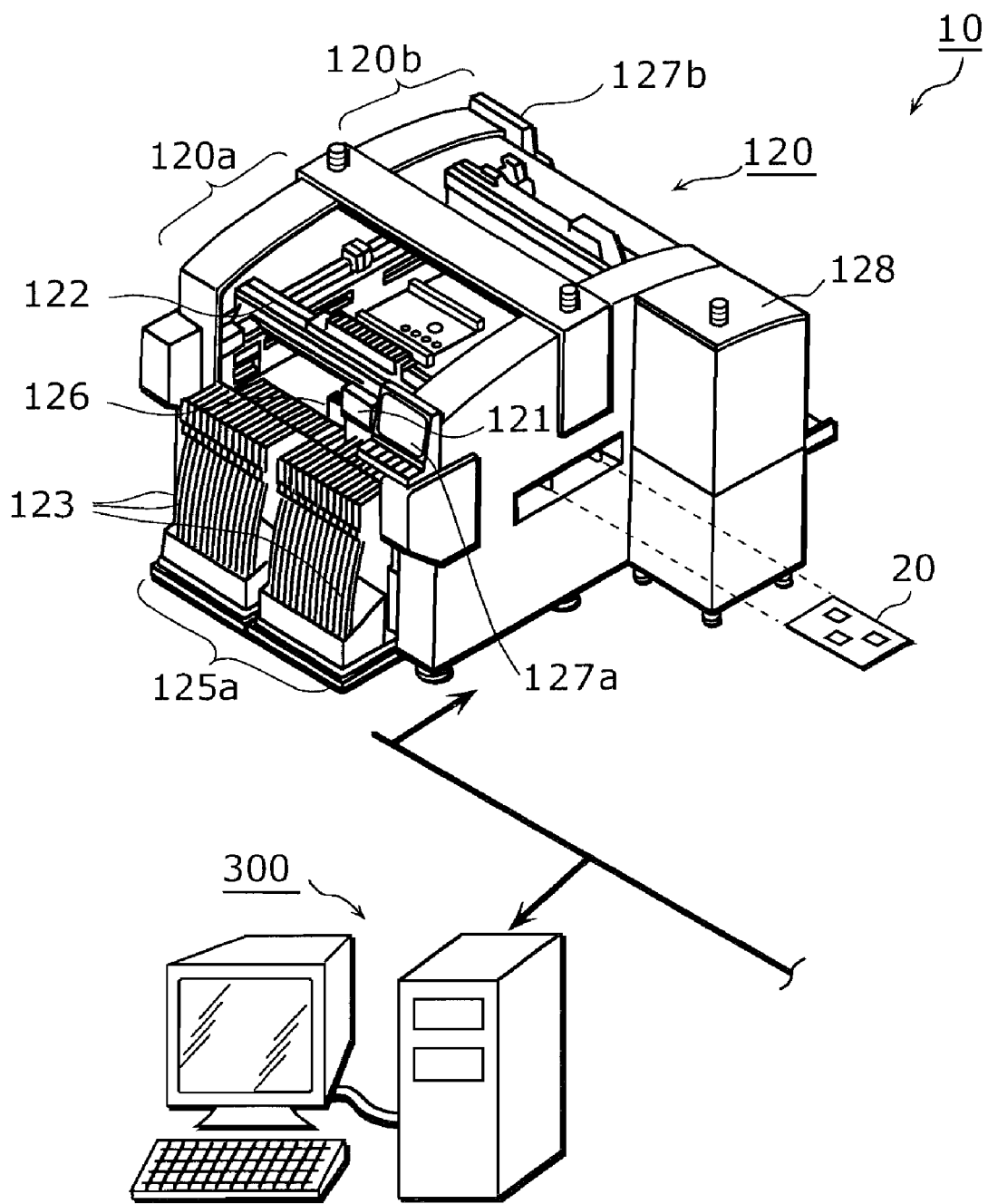
FIG. 1 is an external appearance view showing a configuration of a component mounting system according to an embodiment of the present invention.

FIG. 1 is an external appearance view showing a configuration of a component mounting system according to an embodiment of the present invention.

A component mounting system 10 is a system for mounting components onto a board so as to produce a circuit board, and includes a component mounter 120 and a component mounting condition determining apparatus 300.

The component mounter 120 is an apparatus for mounting electronic components while transferring the circuit board from upstream to downstream, and includes two pieces of sub-equipment (a front sub-equipment 120a and a rear sub-equipment 120b) for performing component mounting in the form of cooperated alternate operation. Here, in the present embodiment, description is given for the case where a line gang pickup head 121 is provided on the front side (front sub-equipment 120a) and the rear side (rear sub-equipment 120b). However, the component mounter according to the present invention is not limited to a component mounter of this type. For example, a component mounter may be employed in which a line gang pickup head is provided in each of the upstream and the downstream sides of the board transportation direction and in which the line gang pickup heads alternately mount components onto a board in a cooperated manner. That is, regardless of the arrangement of the line gang pickup heads, the present invention is applicable to a component mounter provided with a plurality of line gang pickup heads that move different distances between the component supply unit and the board.

The front sub-equipment 120a includes: a component supply unit 125a composed of an array of component cassettes 123 each accommodating a component tape; a line gang pickup head 121 having a plurality of pickup nozzles (referred to simply as "nozzles", in some cases hereinafter) capable of picking up electronic components from the component cassettes 123 and mounting them onto a board 20; a beam 122 to which the line gang pickup head 121 is attached; and a component recognizing camera 126 that inspects in a two-dimensional or three-dimensional manner the pickup state of components picked up by the line gang pickup head 121. The rear sub-equipment 120b also has a configuration similar to that of the front sub-equipment 120a. Here, the rear sub-equipment 120b has a tray supply unit 128 for supplying tray components. However, the tray supply unit 128 and the like are not provided in some cases depending on the sub-equipment.

Here, the "component tape" indicates a tape (carrier tape) on which a plurality of components of the same component type are arranged. This tape is supplied in a state wound around a reel (supply reel) or the like, and is used mainly for supplying components having a comparatively small size and referred to as chip components, to a component mounter.

Specifically, the component mounter 120 is a mounting apparatus that has both the function of a component mounter referred to as a high-speed mounter and the function of a component mounter referred to as a multifunctional mounter. The high-speed mounter generally indicates an apparatus that mounts electronic components of 10 mm square or smaller at a speed of 0.1 second each or the like and that is characterized by high productivity. The multifunctional mounter indicates an apparatus that mounts large-size electronic components of 10 mm square or larger, irregularly shaped components such as switches and connectors, and IC components such as a Quad Flat Package (QFP) and a Ball Grid Array (BGA).

That is, the component mounter 120 is designed to be capable of mounting almost all types of electronic components (the range of components to be mounted extends from a 0.4-mm×0.2-mm chip resistor to a 200-mm connector). Thus, when a necessary number of the component mounters 120 are merely arranged, a mounting line can be constructed.

Figure 2:
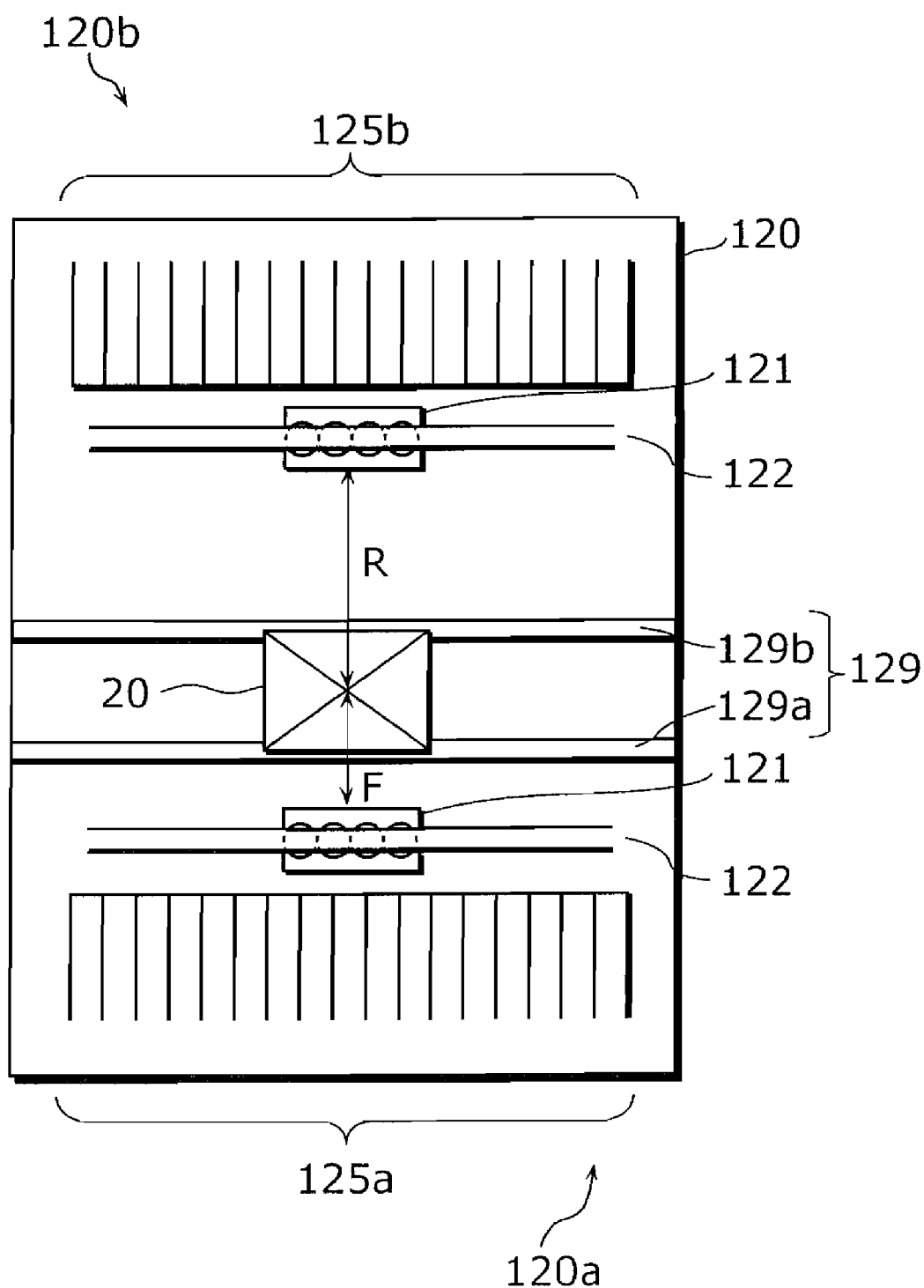
FIG. 2 is a plan view showing a major configuration of inside of a component mounter.

FIG. 2 is a plan view showing a major configuration of inside of a component mounter 120.

In the inside of the component mounter 120, the front sub-equipment 120a and the rear sub-equipment 120b are provided in the forward and backward directions (Y-axis direction) of the component mounter 120 which are perpendicular to the transportation direction (X-axis direction) for the board 20.

The front sub-equipment 120a and the rear sub-equipment 120b cooperate with each other so as to perform mounting work on one board 20.

The front sub-equipment 120a and the rear sub-equipment 120b are provided with a component supply unit 125a and a component supply unit 125b, respectively. Further, each of the front sub-equipment 120a and the rear sub-equipment 120b is provided with a beam 122 and a line gang pickup head 121. Furthermore, in the component mounter 120, a pair of rails 129 for board 20 transportation are provided between the front and rear sub-equipment.

The rails 129 are composed of a fixed rail 129a and a movable rail 129b. The position of the fixed rail 129a is fixed in advance, whereas the movable rail 129b can be moved in the Y-axis direction in accordance with the length of the transported board 20 in the Y-axis direction.

Here, the component recognizing camera 126, the tray supply unit 128 and the like are not essential parts of the present invention. Thus, description is omitted in the figure.

The beam 122 is a rigid body extending in the X-axis direction, and can move on a railway (not shown) provided in the Y-axis direction (perpendicular to the transportation direction for the board 20), with maintaining the state of being parallel to the X-axis direction. Further, the beam 122 allows the line gang pickup head 121 attached to the beam 122 to move along the beam 122, that is, in the X-axis direction. Thus, by virtue of the movement of itself in the Y-axis direction and the X-axis directional movement of the line gang pickup head 121 that moves in the Y-axis direction in association with the above-mentioned movement, the line gang pickup head 121 can move freely in the XY plane. Further, a plurality of motors such as motors (not shown) for driving these are provided in the beam 122. Electric power to these motors and the like is supplied via the beam 122.

Figure 3:
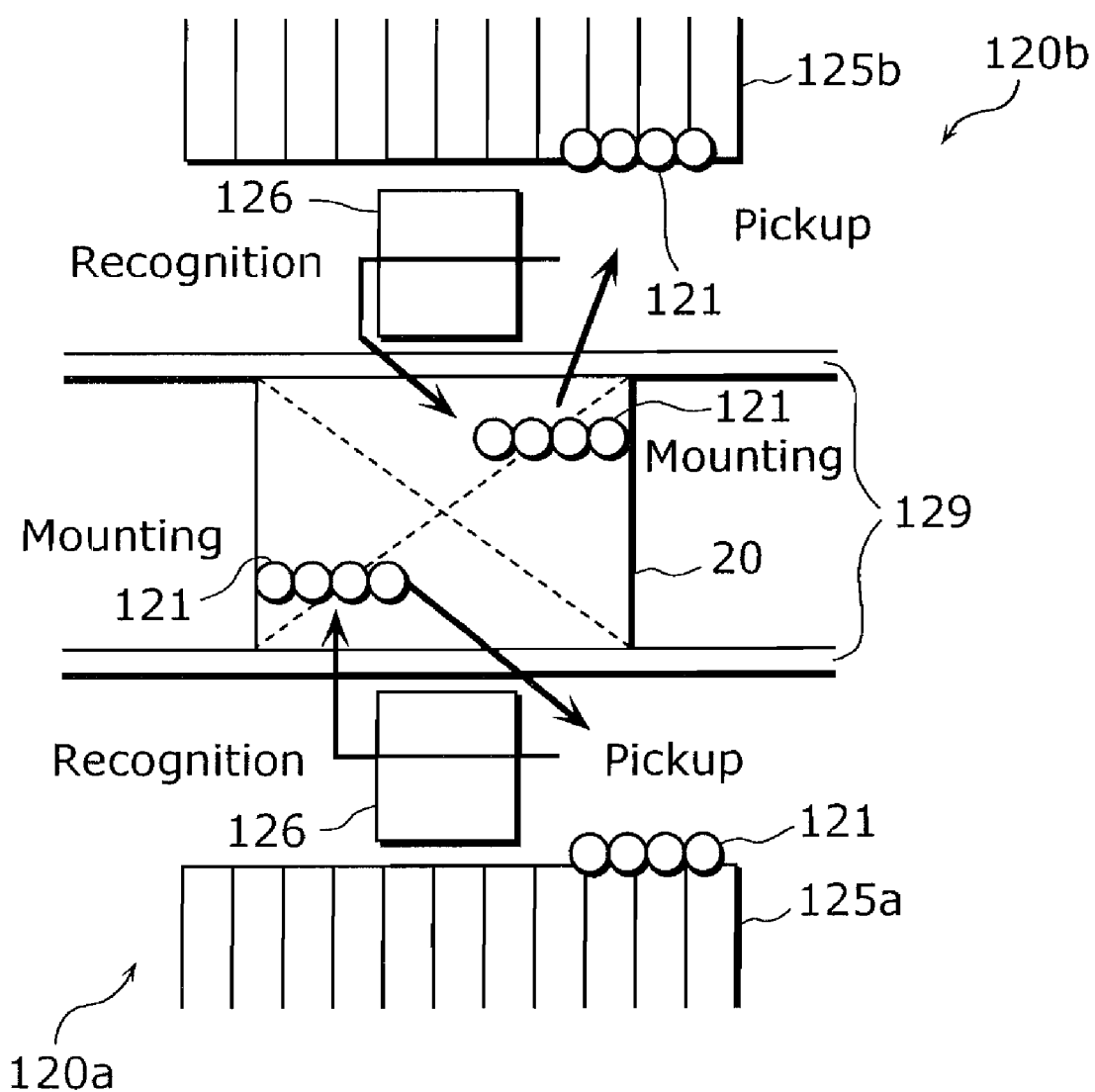
FIG. 3 is a diagram describing component mounting performed by a component mounter.

FIGS. 3 and 4 are diagrams describing component mounting performed by a component mounter 120.

As shown in FIG. 3, the line gang pickup head 121 of the rear sub-equipment 120b alternately repeats three kinds of operation composed of "pickup" of the components from the component supply unit 125b, "recognition" of the picked-up components by using the component recognizing camera 126, and "mounting" of the recognized components onto the board 20, and thereby mounts the components onto the board 20.

Here, the line gang pickup head 121 of the front sub-equipment 120a similarly repeats alternately the three kinds of operation composed of "pickup", "recognition" and "mounting", and thereby mounts the components onto the board 20.

Figure 4A:
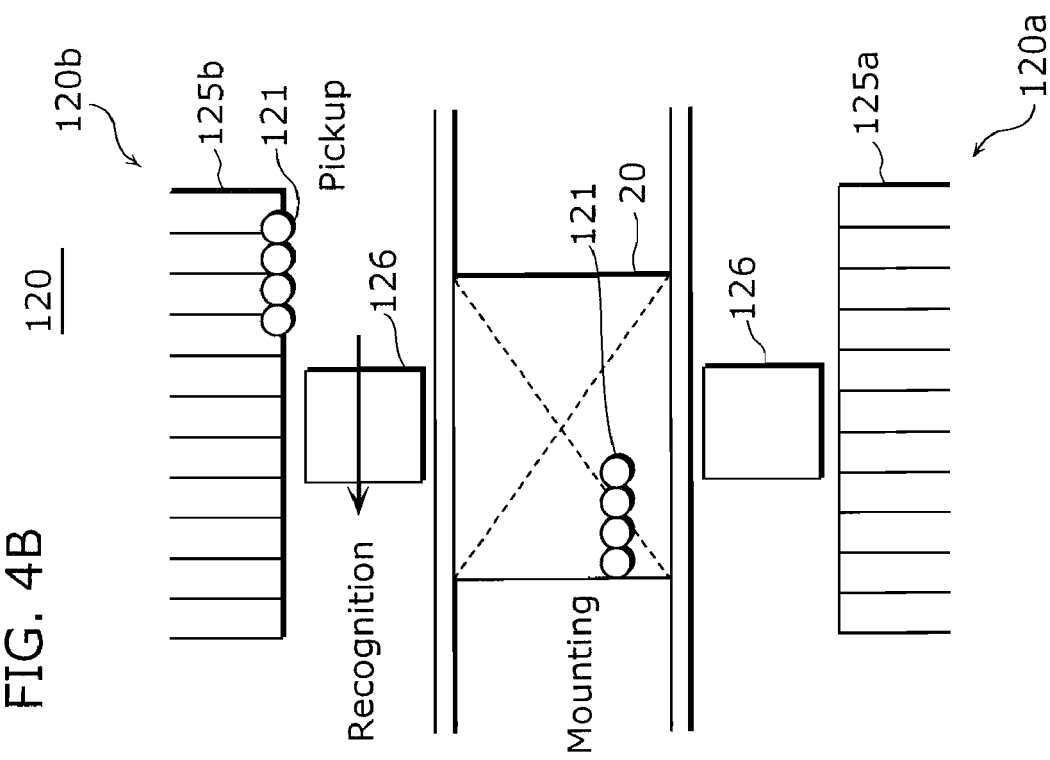
FIG. 4A is a diagram describing component mounting performed by a component mounter.
Figure 4B:
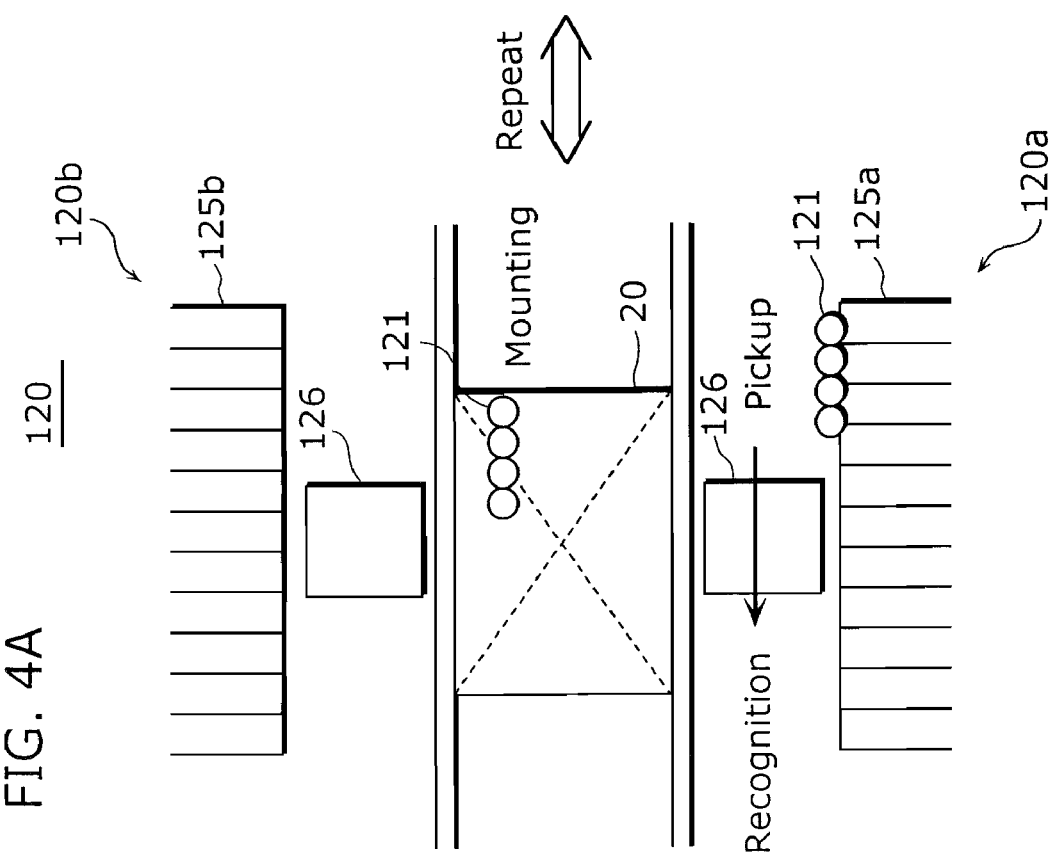
FIG. 4B is a diagram describing component mounting performed by a component mounter.

Here, when the two line gang pickup heads 121 simultaneously perform "mounting" of the components, in order that collision should be avoided between the line gang pickup heads 121, the two line gang pickup heads 121 mount the components onto the board 20 in the form of coordinated operation. Specifically, as shown in FIG. 4A, when the line gang pickup head 121 of the rear sub-equipment 120b performs "mounting" operation, the line gang pickup head 121 of the front sub-equipment 120a performs "pickup" operation and "recognition" operation. In contrast, as shown in FIG. 4B, when the line gang pickup head 121 of the front sub-equipment 120a performs "mounting" operation, the line gang pickup head 121 of the rear sub-equipment 120b performs "pickup" operation and "recognition" operation. As such, when the two line gang pickup heads 121 perform "mounting" operation alternately, collision can be avoided between the line gang pickup heads 121. Here, in an ideal case, during the time that "mounting" operation is performed by one line gang pickup head 121, if "pickup" operation and "recognition" operation by the other line gang pickup head 121 are completed, the "mounting" operation to be performed by the other line gang pickup head 121 can be started without delay at the time that the "mounting" operation by one of the line gang pickup heads 121 has been completed. This improves production efficiency.

Figure 5:
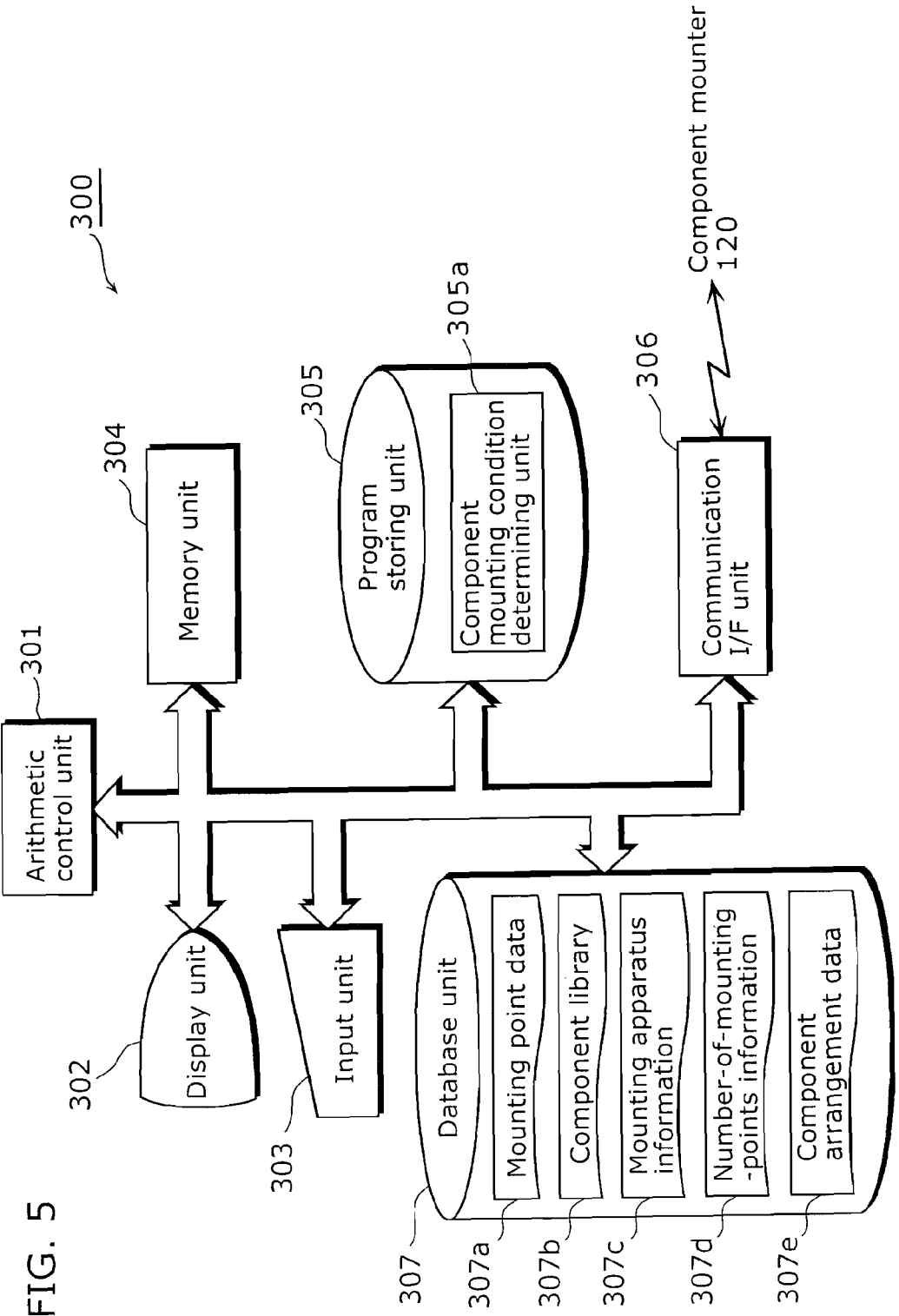
FIG. 5 is a block diagram showing a function configuration of a component mounting condition determining apparatus.

FIG. 5 is a block diagram showing a function configuration of a component mounting condition determining apparatus 300.

The component mounting condition determining apparatus 300 is a computer for performing the processing of determining a component mounting order onto the board 20 for each component mounter and determining component supplying positions for each component mounter, and includes an arithmetic control unit 301, a display unit 302, an input unit 303, a memory unit 304, a program storing unit 305, a communication interface (I/F) unit 306, and a database unit 307. As describes below, the component mounting condition determining apparatus 300 determines a component mounting condition for the component mounter 120 such that the operating time of the line gang pickup head 121 of the front sub-equipment 120a and the operating time of the line gang pickup head 121 of the rear sub-equipment 120b become approximately equal to each other.

The component mounting condition determining apparatus 300 is implemented by a general-purpose computer system such as a personal computer that executes a program according to the present invention. In a state not connected to the component mounter 120, the component mounting condition determining apparatus 300 serves also as a stand-alone simulator (a tool for component mounting condition determination). Here, the function of the component mounting condition determining apparatus 300 may be installed inside the component mounter 120.

The arithmetic control unit 301 is a Central Processing Unit (CPU), a numerical processor or the like. In response to an instruction from the operator or the like, the arithmetic control unit 301 loads a necessary program from the program storing unit 305 to the memory unit 304, and executes it. Then, in accordance with the execution result, the arithmetic control unit 301 controls individual units 302 to 307.

The display unit 302 is a Cathode-Ray Tube (CRT), a Liquid Crystal Display (LCD) or the like, while the input unit 303 is a keyboard, a mouse or the like. These units are used for interactive operation or the like between the component mounting condition determining apparatus 300 and an operator, under the control of the arithmetic control unit 301.

The communication I/F unit 306 is a Local Area Network (LAN) adapter or the like, and is used for communication or the like between the component mounting condition determining apparatus 300 and the component mounter 120. The memory unit 304 is a Random Access Memory (RAM) or the like that provides a working area for the arithmetic control unit 301.

The database unit 307 is a hard disk or the like that stores, for example: input data (such as mounting point data 307a, a component library 307b, mounting apparatus information 307c, and number-of-mounting-points information 307d) used for the component mounting condition determination processing performed by the component mounting condition determining apparatus 300; and component arrangement data that is generated as a result of processing performed by the component mounting condition determining apparatus 300 and that indicates the component arrangement in the component supply unit.

FIGS. 6 to 9 are diagrams respectively showing examples of the mounting point data 307a, the component library 307b, the mounting apparatus information 307c and the number-of-mounting-points information 307d.

The mounting point data 307a is a group of the information that indicates the mounting points for all components to be mounted. As shown in FIG. 6, one mounting point pi is composed of a component type ci, an X-coordinate xi, a Y-coordinate yi, control data φi, and a mounting angle θi. Here, the "component type" corresponds to the component name in the component library 307b shown in FIG. 7. The "X-coordinate" and the "Y-coordinate" are the coordinates of the mounting point (coordinates that indicate a particular position on the board). The "control data" is constraint information concerning the mounting of the component (such as the type of a pickup nozzle that can be used and the maximum moving speed of the line gang pickup head 121). Here, Numeric Control (NC) data to be acquired finally is a sequence of mounting points that minimizes a line tact. The "mounting angle" indicates an angle of a component by which the pickup nozzle having picked up a component of component type ci needs to rotate the component between the time point of component pickup and the time point of component mounting.

The component library 307b is a library generated by collecting information specific to each of all component types that can be processed by the component mounter 120. As shown in FIG. 7, the component library 307b contains for each component type: a component size; a tact (the tact specific to the component type under a particular condition); and other constraint information (such as the type of a pickup nozzle that can be used, the recognition method used by the component recognizing camera 126, and the maximum speed level of the line gang pickup head 121). Here, in the figure, external appearances of components of various component types are also shown for convenience.

Figure 8:
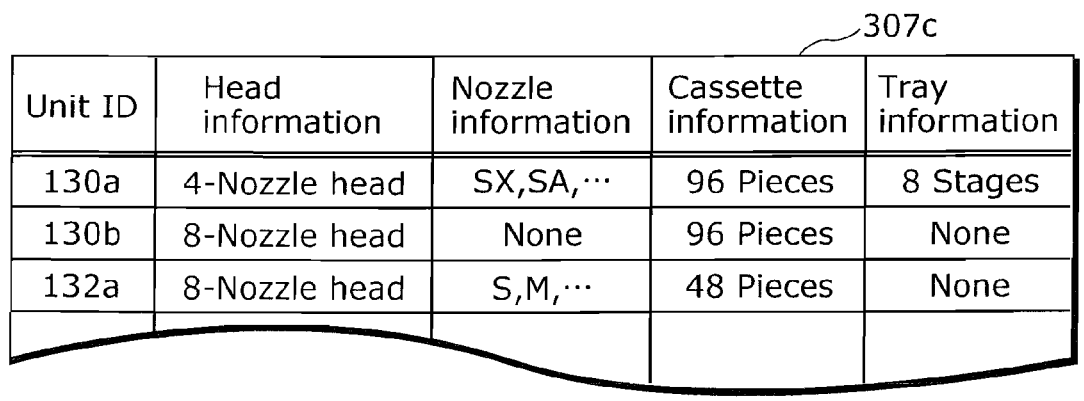
FIG. 8 is a diagram showing an example of mounting apparatus information.

The mounting apparatus information 307c is information that indicates the apparatuses configuration, the above-mentioned constraint, and the like for all individual sub-equipment that make up the production line. As shown in FIG. 8, the mounting apparatus information 307c includes: head information concerning the type of the line gang pickup head 121, that is, for example, concerning the number of pickup nozzles provided in the line gang pickup head 121; nozzle information, for example, concerning the type of the pickup nozzles that can be attached to the line gang pickup head 121; cassette information, for example, concerning the maximum number of component cassettes 123; and tray information, for example, concerning the number of trays held in the tray supply unit 128.

The number-of-mounting-points information 307d is information in which correspondence is established between each component type of the mounting point to be mounted onto the board and its number (the number of mounting points for the component). As shown in FIG. 9, the component types mounted by the component mounter 120 are five types of A, B, C, D and E, while the numbers of mounting points are 6, 7, 8, 9 and 2, respectively.

The program storing unit 305 shown in FIG. 5 is a hard disk that stores various programs for implementing the function of the component mounting condition determining apparatus 300. The program is a program that determines a component mounting condition used by the component counter 120, and is constructed from the component mounting condition determining unit 305a and the like in terms of the function (in the form of a processing unit that expresses the function when executed by the arithmetic control unit 301).

The component mounting condition determining unit 305a determines a component mounting condition such that the operating times are equalized for the two line gang pickup heads 121.

Operation is described below for the component mounting condition determining apparatus 300 having the above-mentioned configuration.

Figure 10:
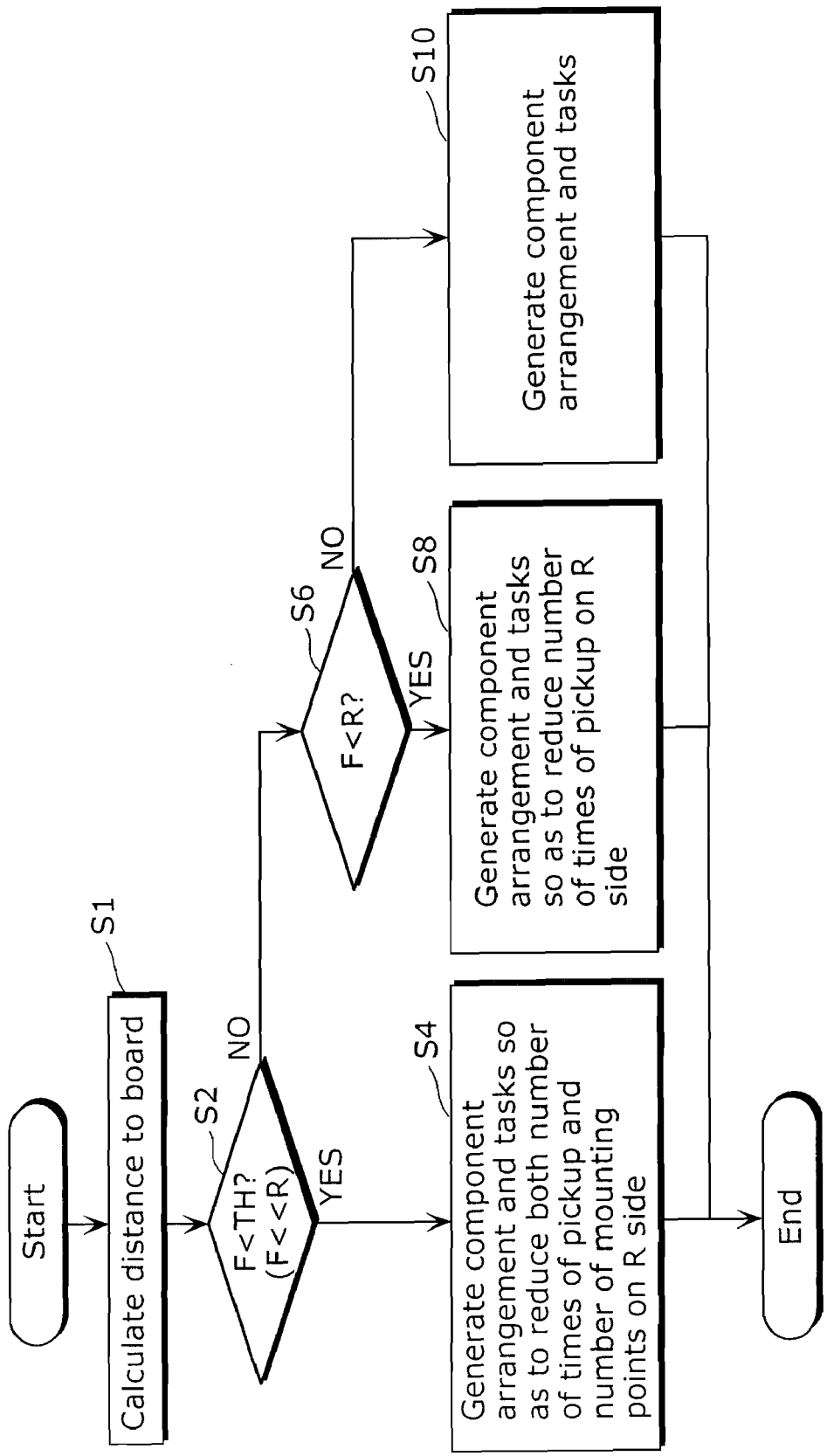
FIG. 10 is a flow chart of processing executed by a component mounting condition determining apparatus.

FIG. 10 is a flow chart of processing executed by the component mounting condition determining apparatus 300.

Based on the length of the board 20 in of the Y-axis direction or the position of the movable rail 129b in the Y-axis direction, the component mounting condition determining unit 305a calculates the distance from the line gang pickup head 121 of the front sub-equipment 120a to the center of the board 20. Further, the component mounting condition determining unit 305a calculates also the distance from the line gang pickup head 121 of the rear sub-equipment 120b to the center of the board 20 (S1).

Figure 11:
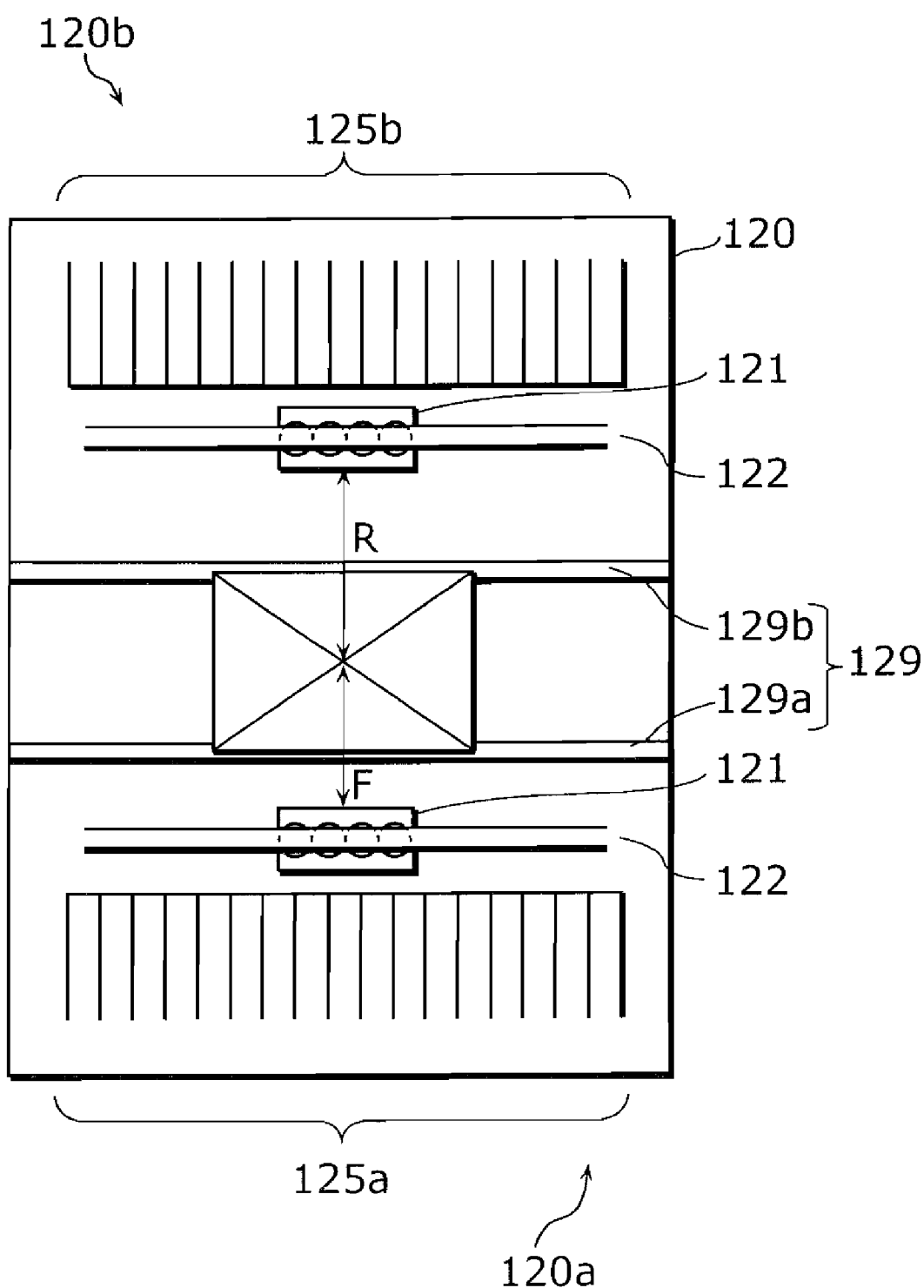
FIG. 11 is a diagram showing relation between a fixed rail and a movable rail in the case of a middle size board.

As shown in FIG. 2, when the distance from the line gang pickup head 121 of the front sub-equipment 120a to the center of the board 20 is denoted by F while the distance from the line gang pickup head 121 of the rear sub-equipment 120b to the center of the board 20 is denoted by R, the relation between F and R is classified into three kinds. That is, when the size of the board 20 is small as shown in FIG. 2, the relation $F \ll R$ holds. Further, when the size of the board 20 is middle as shown in FIG. 11, the relation $F<R$ holds. Furthermore, when the size of the board 20 is maximum as shown in FIG. 12, the relation $F=R$ holds.

The component mounting condition determining unit 305a judges whether F is smaller than a predetermined threshold TH (S2). When $F<TH$ (YES in S2), the component mounting condition determining unit 305a determines that the relation $F \ll R$ as shown in FIG. 2 holds, and then generates component arrangement and tasks such as to minimize both the number of times of pickup and the number of mounting points of the rear sub-equipment 120b (S4). Here, the "task" indicates a set of operations including pickup, movement and mounting of the components, which are repeatedly performed by the line gang pickup head 121. The processing in S4 is described later. Here, the determination in S2 is not limited to that described above, and may be another determining method. For example, it may be judged whether R is larger than a predetermined threshold TH2. Then, when $R>TH2$, it may be determined that the relation $F \ll R$ holds. Further, F may be compared directly with R.

When $F>=TH$ (NO in S2), the component mounting condition determining unit 305a judges whether $F<R$ or not (S6). When $F<R$ (YES in S6), the component mounting condition determining unit 305a determines that the relation $F<R$ as shown in FIG. 11 holds, and then generates component arrangement and tasks such as to minimize the number of times of pickup of the rear sub-equipment 120b (S8). The processing in S8 is described later.

Figure 12:
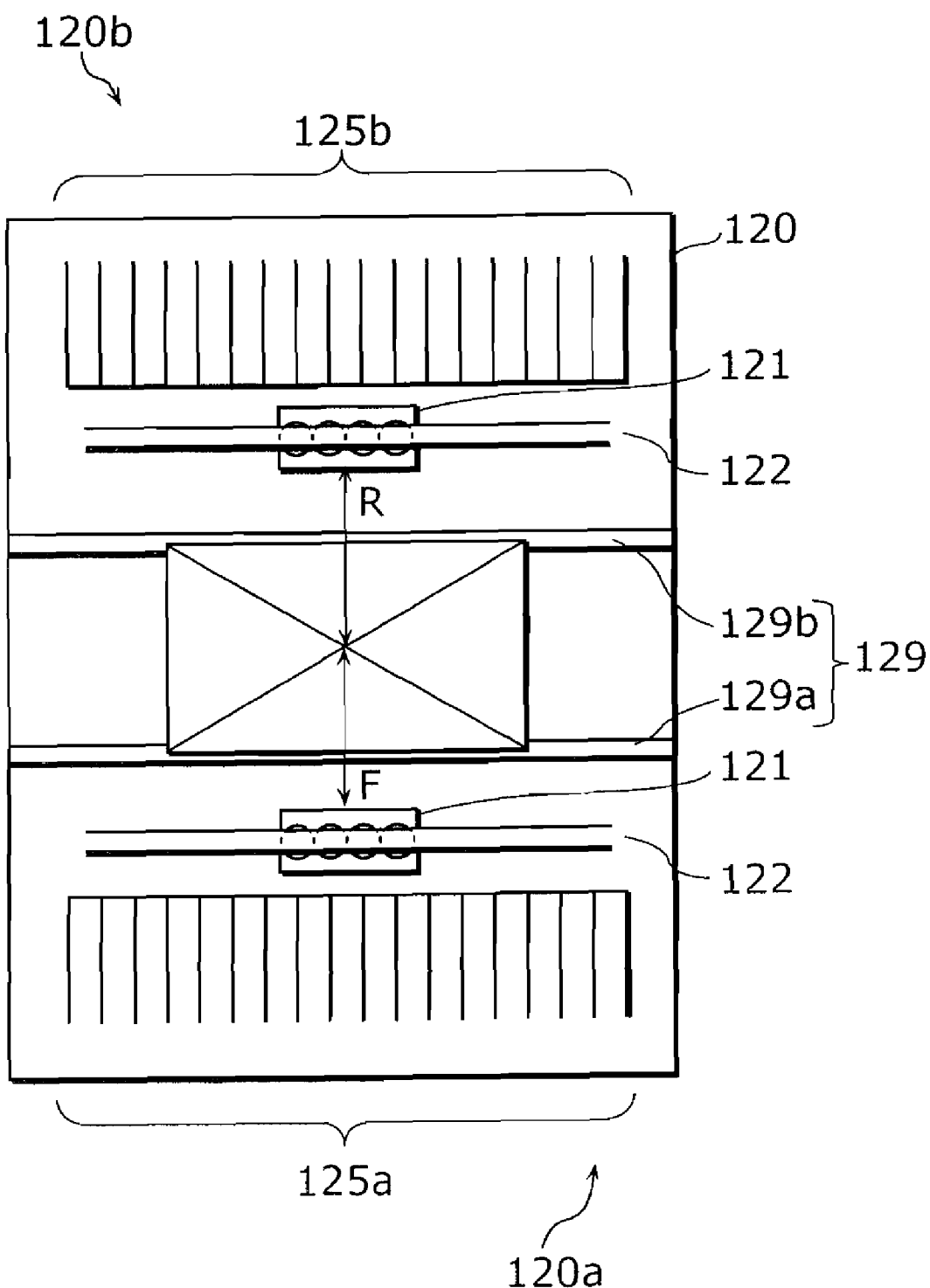
FIG. 12 is a diagram showing relation between a fixed rail and a movable rail in the case of a maximum size board.

When $F<R$ does not hold (NO in S6), the component mounting condition determining unit 305a determines that the relation $F=R$ holds as shown in FIG. 12, and then generates component arrangement and tasks (S10). The processing in S10 is described later.

Next, processing in S4, S8 and S10 is described below. For convenience of description, explanation is given in the order of S10, S8 and S4.

Figure 13:
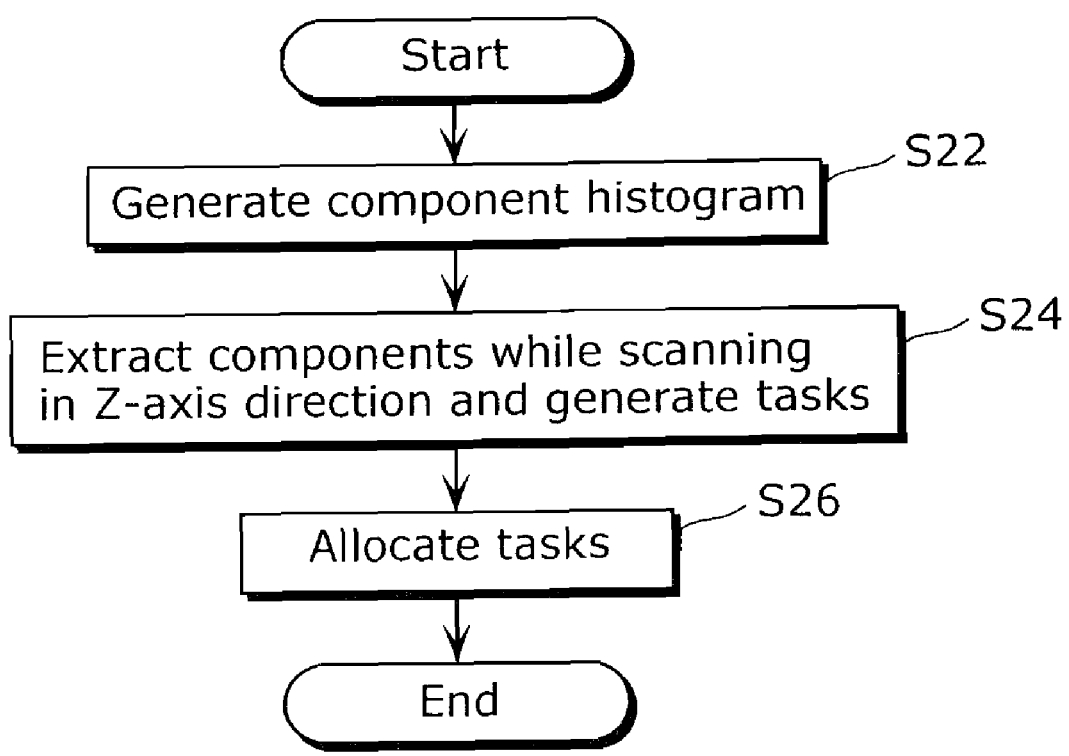
FIG. 13 is a flow chart of generation processing for component arrangement and tasks in the case where F=R (S10 in FIG. 10)

FIG. 13 is a flow chart of generation processing for component arrangement and tasks in the case where $F=R$ (S10 in FIG. 10). FIGS. 14A to 14F are diagrams that describe processing shown in FIG. 13.

First, based on the number-of-mounting-points information 307d shown in FIG. 9, the component mounting condition determining unit 305a generates a component histogram. That is, as shown in FIG. 14A, a component histogram is generated in which the horizontal axis (Z-axis) indicates component names and the vertical axis indicates the number of mounting points for the components (S22).

Then, the component mounting condition determining unit 305a repeats the processing of extracting components and generating tasks while scanning the component histogram in the Z-axis direction starting at the bottom side toward the top side, until all components are completed (S24).

Here, the line gang pickup head 121 on the front sub-equipment 120a side (referred to as the "front side", hereinafter) and the line gang pickup head 121 on the rear sub-equipment 120b side (referred to as the "rear side", hereinafter) have four pickup nozzles, respectively. Thus, one task can contain four components at maximum. Accordingly, when four components are extracted at a time while scanning the histogram shown in FIG. 14A in the Z-axis direction starting at the bottom side toward the top side, components of component types D, C, B and A are extracted first so that a first task is generated. Such processing is repeated also for the second and subsequent tasks. As a result, eight tasks are generated as shown in FIG. 14B. In FIG. 14B, a task located at a lower position indicates a task generated in an earlier step. That is, the task in the bottom is that generated first, while the task on the top is that generated last.

Then, the component mounting condition determining unit 305a allocates the tasks generated in the processing in S24, to the two line gang pickup heads 121 (S26). For example, the tasks shown in FIG. 14B are allocated one by one to the front sub-equipment 120a and the rear sub-equipment 120b. FIG. 14C shows an example of the tasks allocated to the front sub-equipment 120a, while FIG. 14D shows an example of the tasks allocated to the rear sub-equipment 120b. That is, among the eight tasks shown in FIG. 14B, the tasks located at odd turns counted from the bottom are the tasks for the front sub-equipment 120a shown in FIG. 14C, while the tasks located at even turns are the tasks for the rear sub-equipment 120b shown in FIG. 14D.

Here, FIG. 14E shows arrangement of the component cassettes of the component supply unit 125a of the front sub-equipment 120a, while FIG. 14F shows arrangement of the component cassettes of the component supply unit 125b of the rear sub-equipment 120b. The arrangement of the component cassettes is assumed to be in the descending order of the number of entire components (in the order of component types D, C, B, A and E, in this example) as shown in the histogram of FIG. 14A.

Next, generation processing for component arrangement and tasks in the case where F<R (S8 in FIG. 10) is described below.

Figure 15:
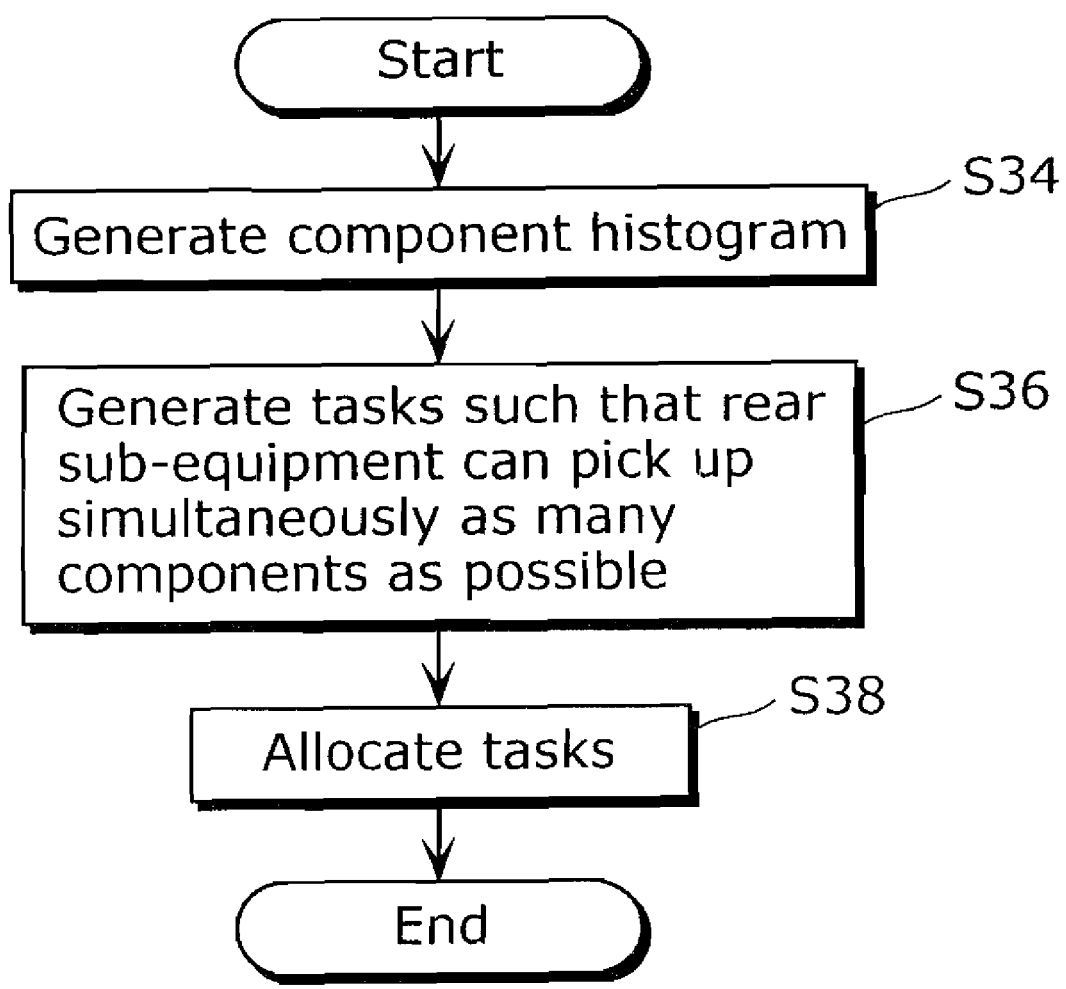
FIG. 15 is a flow chart of generation processing for component arrangement and tasks in the case where F<R (S8 in FIG. 10)

FIG. 15 is a flow chart of generation processing for component arrangement and tasks in the case where F<R (S8 in FIG. 10).

Based on the number-of-mounting-points information 307d, the component mounting condition determining unit 305a generates a component histogram. That is, as shown in FIG. 16A, a component histogram is generated in which the horizontal axis (Z-axis) indicates component names and the vertical axis indicates the number of mounting points for the components (S34). Here, the histogram shown in FIG. 16A is the same as that shown in FIG. 14A.

Then, the component mounting condition determining unit 305a generates tasks such that the line gang pickup head 121 on the rear side can pick up simultaneously as many components as possible (S36). Here, it is assumed that in the front sub-equipment 120a and the rear sub-equipment 120b, component cassettes are aligned in the order of the number of mounting points, that is, in the order of component types D, C, B, A and E. When the component cassettes are aligned in this manner, in order that the line gang pickup head 121 can pick up the components for one task by one pickup operation, it is sufficient that component types D, C, B and A or component types C, B, A and E make up one task. Here, as shown in FIG. 16B, components for one task that can be picked up simultaneously in one pickup operation are extracted in descending order of the number of mounting points in the component histogram of FIG. 16A, so that tasks are generated. That is, as shown in FIG. 16B, six tasks component types D, C, B and A are generated. These six tasks are indicated by thick frames.

FIG. 16C is a diagram showing remaining component types. Also for the remaining component types, tasks are generated such as to reduce the number of times of pickup in one task. That is, when component types D, C and B are contained into one task, the three components can be picked up simultaneously. From the remaining component types shown in FIG. 16C, two tasks are finally generated as shown in FIG. 16D.

FIG. 16E illustrates collectively the tasks shown in FIG. 16B and the tasks shown in FIG. 16D. The tasks up to the sixth counted from the bottom are tasks each of which can be picked up simultaneously in one pickup operation.

Then, the component mounting condition determining unit 305a allocates the eight tasks shown in FIG. 16E to the front side and the rear side (S38). Specifically, among the eight tasks shown in FIG. 16E, the lower four tasks are allocated to the rear side, while the four upper tasks are allocated to the front side. FIG. 16F is a diagram showing an example of tasks for the rear side, while FIG. 16G is a diagram showing an example of tasks for the front side. When the tasks are allocated as described here, tasks in which all components can be picked up simultaneously in one pickup operation can be assigned to the rear side. The line gang pickup head 121 on the rear side moves a longer distance from the component supply unit 125b to the board 20 than the line gang pickup head 121 on the front side. Thus, the situation that allows the line gang pickup head 121 on the rear side to pick up the components simultaneously reduces the time necessary for pickup. Thus, as a whole, the operating times of the component mounters can approximately be equalized for the front side and the rear side.

In the above-mentioned example, the total of the numbers of tasks for the front side and the rear side has been even. This has allowed the numbers of tasks for the front side and the rear side to be the same. However, when the total of the numbers of tasks for the front side and the rear side is odd, the tasks are allocated such that the number of tasks for the front side is greater by one than that for the rear side.

Here, FIG. 16H shows arrangement of the component cassettes of the component supply unit 125b of the rear sub-equipment 120b, while FIG. 16I shows arrangement of the component cassettes of the component supply unit 125a of the front sub-equipment 120a.

FIG. 16J is a diagram describing the number of times of pickup in the tasks for the rear side shown in FIG. 16F. FIG. 16K is a diagram describing the number of times of pickup in the tasks for the front side shown in FIG. 16G. As shown in FIG. 16J, in each of the four tasks for the rear side, the components can be picked up in one pickup operation. In contrast, as shown in FIG. 16K, in the first two tasks among the four tasks for the front side, the components can be picked up in one pickup operation. However, the third task requires two pickup operations in order to pick up all components within the task. Further, the fourth task requires three pickup operations. That is, in the third task, the components of component types D, C and B are picked up in the first pickup operation, and then the component of component type D is picked up in the second pickup operation. Further, in the fourth task, the components of component types D and C are picked up in the first pickup operation, and then the component of component type E is picked up respectively in the second and the third pickup operations.

Next, generation processing for component arrangement and tasks in the case where F<<R (S4 in FIG. 10) is described below.

Figure 17:
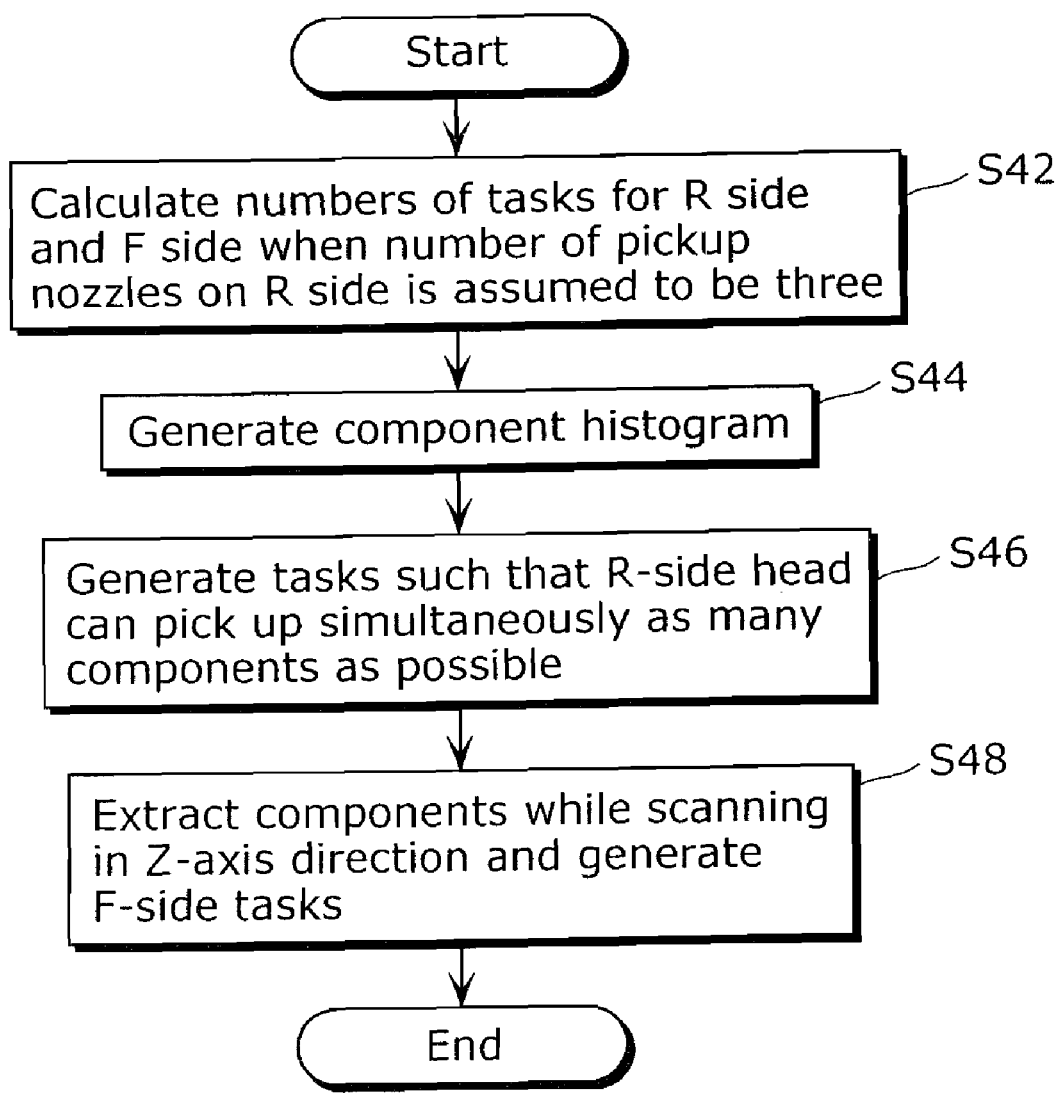
FIG. 17 is a flow chart of generation processing for component arrangement and tasks in the case where F<<R (S4 in FIG. 10)

FIG. 17 is a flow chart of generation processing for component arrangement and tasks in the case where F<<R (S4 in FIG. 10).

The component mounting condition determining unit 305a calculates in advance the number of tasks for the front side and the rear side (S42). Here, in this example, in order that the pickup time and the mounting time for the components on the rear side should be reduced, the number of mounting points on the rear side is set smaller than that for the front side. Thus, in the line gang pickup head 121 on the rear side, not all pickup nozzles are used. That is, one pickup nozzle is stopped so that component mounting is performed by the remaining pickup nozzles. The number of tasks for the front side is determined by the following expression.

Number of tasks for front side=total number of mounting points/(total number of nozzles−1)

Here, a quantity below the decimal point is to be rounded up. When the quantity below the decimal point is rounded up, the number of tasks for the front side becomes greater by one than, or equal to, the number of tasks for the rear side.

Here, the total number of mounting points indicates the number of components mounted onto one board. Further, the total number of nozzles indicates the number of nozzles obtained by adding the number of nozzles of the line gang pickup head 121 on the front side and the number of nozzles of the line gang pickup head 121 on the rear side. In this example, since the number of nozzles is four each for the line gang pickup heads 121 on the front side and the rear side, the total number of nozzles is eight.

Thus, the number of tasks for the front side is obtained to be 32/(8−1)=4.57≈5. The number of tasks for the rear side is determined by the following expression.

Number of tasks for rear side=(total number of mounting points−number of tasks for front side× total number of nozzles on front side)/(total number of nozzles on rear side−1)

Here, a quantity below the decimal point is to be rounded up.

Here, the total number of mounting points is 32. The number of tasks for the front side is 5. The total number of nozzles on the front side is 4. The total number of nozzles on the rear side is 4. Thus, the number of tasks for the rear side is obtained to be (32−5×4)/(4−1)=4.

Figure 18A:
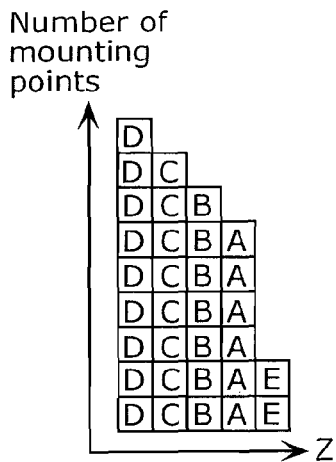
FIG. 18A is a diagram that describes processing shown in FIG. 17.

Then, based on the number-of-mounting-points information 307*d*, the component mounting condition determining unit 305*a* generates a component histogram. That is, as shown in FIG. 18A, a component histogram is generated in which the horizontal axis (Z-axis) indicates component names and the vertical axis indicates the number of mounting points for the components (S44). Here, the histogram shown in FIG. 18A is the same as that shown in FIGS. 14A and 16A.

Figure 18B:
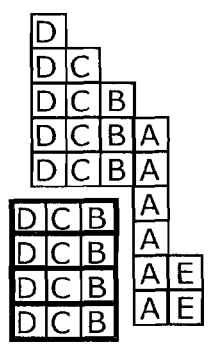
FIG. 18B is a diagram that describes processing shown in FIG. 17.

Then, the component mounting condition determining unit 305*a* generates tasks such that the line gang pickup head 121 on the rear side can pick up simultaneously as many components as possible (S46). Here, it is assumed that in the front sub-equipment 120*a* and the rear sub-equipment 120*b*, component cassettes are aligned in the order of the number of mounting points, that is, in the order of component types D, C, B, A and E. When the component cassettes are aligned in this manner, in order that the line gang pickup head 121 on the rear side can pick up the components for one task by one pickup operation, it is sufficient that component types D, C and B, component types C, B and A or component types B, A and E make up one task. Here, as shown in FIG. 18B, components for one task that can be picked up simultaneously in one pickup operation are extracted in descending order of the number of mounting points in the component histogram of FIG. 18A, so that tasks are generated. That is, as shown in FIG. 18B, four tasks component types D, C and B are generated. These four tasks are indicated by thick frames.

Figure 18C:
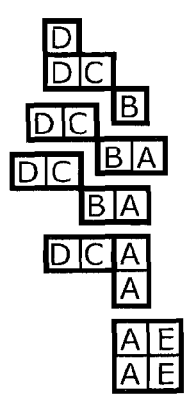
FIG. 18C is a diagram that describes processing shown in FIG. 17.

FIG. 18C is a diagram showing the remaining component types. As for the remaining component types, similarly to processing in S24 in FIG. 13, the component mounting condition determining unit 305*a* repeats the processing of extracting four components at a time and generating a task for the front side while scanning the component histogram in the Z-axis direction starting at the bottom side toward the top side, until all components are completed (S48). Five tasks are generated as a result of this processing.

Figures 18D, 18E:
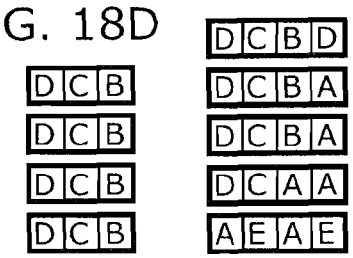
FIG. 18D is a diagram that describes processing shown in FIG. 17.
FIG. 18E is a diagram that describes processing shown in FIG. 17.

FIG. 18D is a diagram showing an example of tasks for the rear side, while FIG. 18E is a diagram showing an example of tasks for the front side. As seen from these figures, the number of tasks for the rear side is 4, while the number of tasks for the front side is 5. Thus, the number of tasks for the rear side is smaller by one.

Figure 18F:
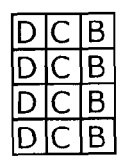
FIG. 18F is a diagram that describes processing shown in FIG. 17.
Figure 18G:
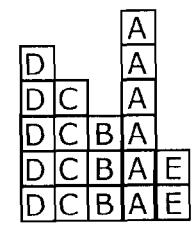
FIG. 18G is a diagram that describes processing shown in FIG. 17.

Here, FIG. 18F shows arrangement of the component cassettes of the component supply unit 125*b* of the rear sub-equipment 120*b*, while FIG. 18G shows arrangement of the component cassettes of the component supply unit 125*a* of the front sub-equipment 120*a*.

Figures 18H, 18I:
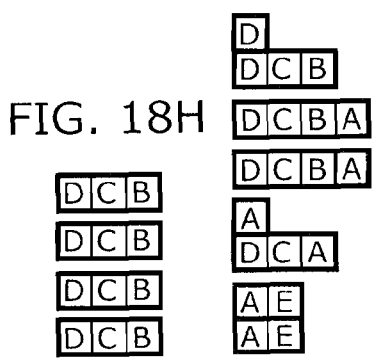
FIG. 18H is a diagram that describes processing shown in FIG. 17.
FIG. 18I is a diagram that describes processing shown in FIG. 17.

FIG. 18H is a diagram describing the number of times of pickup in the tasks for the rear side shown in FIG. 18D. FIG. 18I is a diagram describing the number of times of pickup in the tasks for the front side shown in FIG. 18E. As shown in FIG. 18H, in each of the four tasks for the rear side, the components can be picked up in one pickup operation. In contrast, the tasks for the front side shown in FIG. 18I include one that requires multiple times of pickup of the components. In the task composed of component types A, E, A and E, when simultaneous pickup operation for the component types A and E is performed twice, the components for one task can be picked up.

As described above, tasks for the case where F<<R can be generated. Here, since the number of tasks for the front side is greater by one than the number of tasks for the rear side, component mounting onto the board 20 is performed with adopting a task for the front side as the first task.

As described above, according to an embodiment of the present invention, when the line gang pickup head 121 on the rear side moves a long distance, tasks are generated such that the number of times of component pickup performed by the line gang pickup head 121 on the rear side is smaller than that of the line gang pickup head 121 on the front side. This allows the operating time of the line gang pickup head 121 on the rear side to be approximately equal to the operating time of the line gang pickup head 121 on the front side. Thus, the components can efficiently be mounted onto the board 20.

As described above, the component mounting condition determining method according to the present invention has been explained with reference to an embodiment. However, the present invention is not limited to this embodiment.

For example, in the above-mentioned embodiment, as shown also in the flow chart of FIG. 10, in the case where F<R, the component mounting condition has been determined which allows simultaneous pickup of components on the rear sub-equipment 120*b* side, and further in the case where F<<R, the component mounting condition has been determined which allows reduction of the number of component mounting points on the rear sub-equipment 120*b* side. However, another approach may be employed. That is, any approach may be employed as long as when the degree that R is larger than F increases, operations that require a longer time are performed on the front sub-equipment 120*a* side.

Further, when the number of tasks is odd as shown in FIG. 19, it is preferable that the first task is assigned to the front sub-equipment 120*a*. This reduces the distance that the line gang pickup head 121 moves in the first task, and hence permits that component mounting is started immediately. This situation is similar to the case where the number of tasks is even as shown in FIG. 20.

Figure 21:
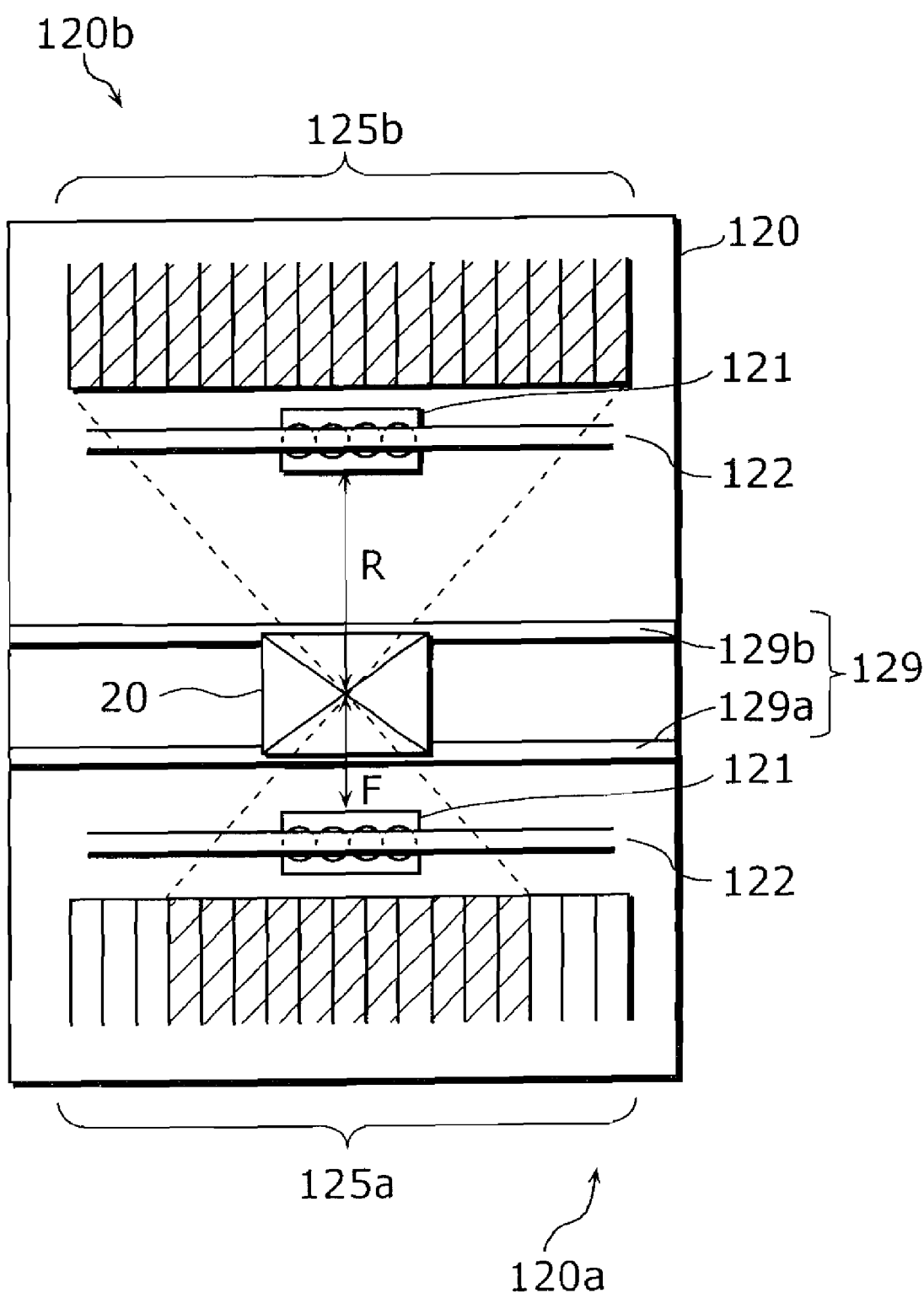
FIG. 21 is a diagram describing a range where a line gang pickup head can move without a tact loss.

Further, in FIG. 21, the dash-dotted lines indicate a range where after mounting the components onto the board, the line gang pickup head 121 can move without a tact loss when the head returns to the component supply unit 125*a* or the component supply unit 125*b*. Thus, when the component cassettes are arranged in the shaded part of the component supply unit 125*a* or the component supply unit 125*b*, the movement distance or the moving time of the line gang pickup head 121 between the board 20 and the component supply unit can be reduced, so that the components can efficiently be mounted onto the board 20.

Figure 22A:
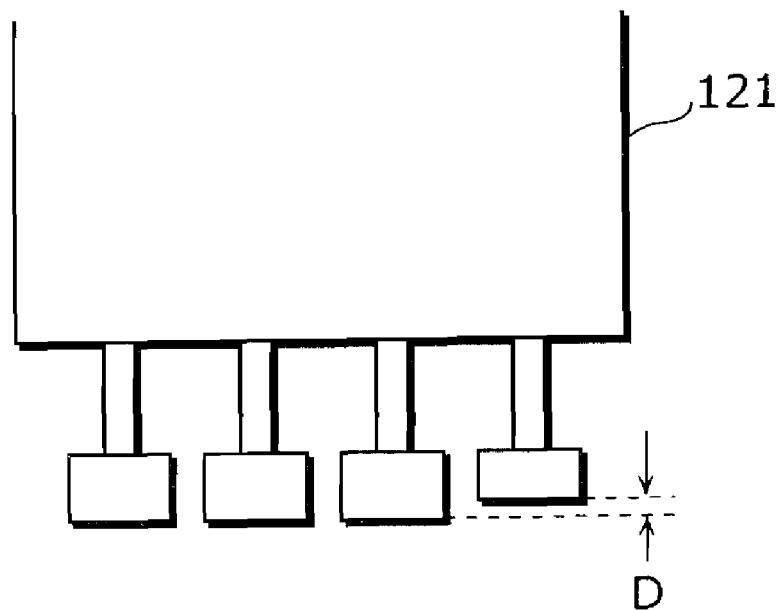
FIG. 22A is a diagram describing a situation of a line gang pickup head in a case where components having different thicknesses are picked up.
Figure 22B:
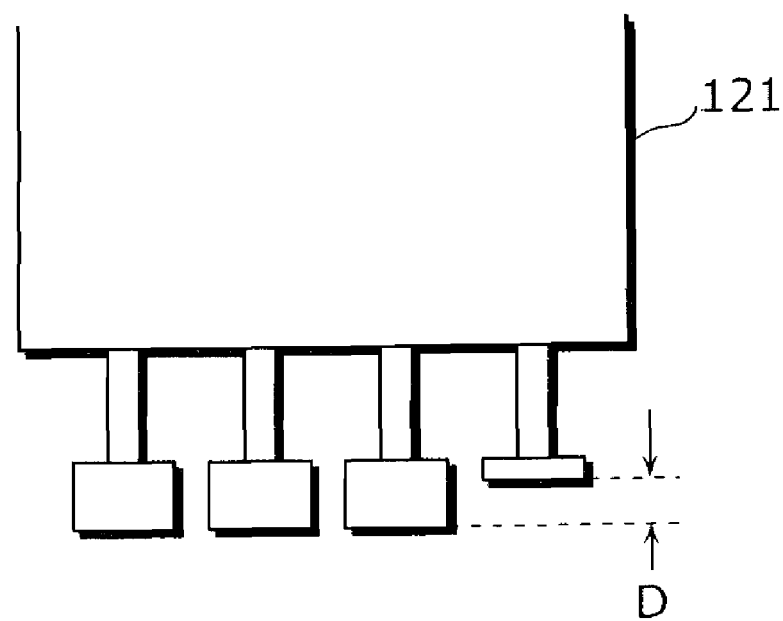
FIG. 22B is a diagram describing a situation of a line gang pickup head in a case where components having different thicknesses are picked up.

Further, the rear sub-equipment 120*b* has the longer distance for the line gang pickup head 121 to move to the board 20 after picking up the components. Thus, component recognition by the component recognizing camera 126 need be performed at a high speed. In a component recognizing camera 126 that inspects the pickup state of the components in two dimensions, when the difference D in the thickness of the components is small as shown in FIG. 22A, all components are located within the depth of view field. Thus, the components can be recognized by one scan. In contrast, when the difference D in the thickness of the components is large as shown in FIG. 22B, some components are not located within the depth of view field. Thus, component recognition need be performed by two or more scans with changing the focal length. Accordingly, in the rear sub-equipment 120b, tasks are generated such as to reduce as much as possible the difference in the thickness of the components. Alternatively, the lengths of the pickup nozzles are adjusted.

Further, when a two-dimensional component recognizing camera 126 and a three-dimensional component recognizing camera 126 are provided in a mixed manner within a single component mounter, the two-dimensional component recognizing camera 126 may be arranged on the rear side. This is because in general, the time necessary for component recognition performed by a two-dimensional component recognizing camera 126 is much shorter than the time necessary for component recognition performed by a three-dimensional component recognizing camera 126. Further, a component thickness sensor, an upright pickup sensor (a sensor that recognizes a component picked up in an upright position) and the like that require a longer processing time than the two-dimensional component recognizing camera 126 may be arranged on the front side.

Further, when line gang pickup heads having different numbers of pickup nozzles from each other are provided in a mixed manner within a component mounter, a line gang pickup head having the smaller number of pickup nozzles may be arranged on the rear side. For example, as shown in FIG. 23, when a line gang pickup head 121a having eight pickup nozzles and a line gang pickup head 121b having four pickup nozzles are present in a mixed manner, the line gang pickup head 121b is arranged on the rear side. This arrangement reduces the pickup time and the mounting time of the line gang pickup head 121b on the rear side. Thus, the operating times including the moving time in addition to these times can approximately be equalized for the front side and the rear side.

Here, the component mounter 120 mounts the components in accordance with the component mounting condition determined by the component mounting condition determining apparatus 300.

Further, the component mounter 120 may be provided with the function of the component mounting condition determining apparatus 300.

Further, the component mounting condition determining apparatus 300 may perform the component mounting condition determination processing shown in FIG. 10 in response to the movement of the movable rail 129b.

Further, the component mounting condition determining apparatus 300 may determine a mounting condition such that a component cassette 123 having a longer feed time for the component tape is arranged on the front side. Specifically, a component cassette 123 that accommodates a component tape having a larger feed amount between the pickup of a component and the feed of the next component to the pickup position may be arranged on the front side with higher priority. This increases the component pickup time of the front side relatively to that of the rear side.

Further, the component mounting condition determining apparatus 300 may determine a mounting condition such that the number of arranged component cassettes on the rear side is smaller relatively to that on the front side. By virtue of this, on the rear side, the component cassettes 123 can be arranged near the center of the component supply unit 125b. This reduces the distance that the line gang pickup head 121 on the rear side moves between the component cassettes 123 at the time of picking up components. This reduces the component pickup time of the rear side relatively to that of the front side.

Further, in the above-mentioned embodiment, a component mounting condition has been acquired for a component mounter that has a line gang pickup head 121 on each of the front side and the rear side. However, the present invention is not limited to a component mounter having this configuration. For example, the present invention may be applied to a component mounter having a configuration that a line gang pickup head 121 opposes an inspection head or an application head. The inspection head is a head for inspecting the component mounting state or falling objects on the board 20, through a 2-D camera or a 3-D camera attached to the head in a state that the head is moved. The application head is a head for applying adhesives onto the board 20 before the component mounting performed by the line gang pickup head 121. The operating time minus the moving time of the inspection head or the application head is smaller than the operating time minus the moving time of the line gang pickup head 121. Thus, the inspection head or the application head may be arrange on the rear side, while the line gang pickup head 121 may be arranged on the front side. As such, when the inspection head or the application head is arranged on the rear side having the longer distance from the home position of the head to the board 20, the operating time of the line gang pickup head 121 can become approximately equal to the operating time of the inspection head or the application head.

Further, the component mounting condition determining apparatus 300 may determine a component mounting condition in accordance with any one of Modifications 1 to 3 described below.

(Modification 1)

In the above-mentioned embodiment, tasks have been generated that permit the line gang pickup head 121 on the rear side to allow simultaneous pickup of the components. In Modification 1, tasks are generated such that the mounting angles are equalized at the time when the line gang pickup head 121 on the rear side, that is, a line gang pickup head 121 provided in a sub-equipment having the longer distance from the component supply unit 125a to the board 20, mounts components in each task.

Figure 24:
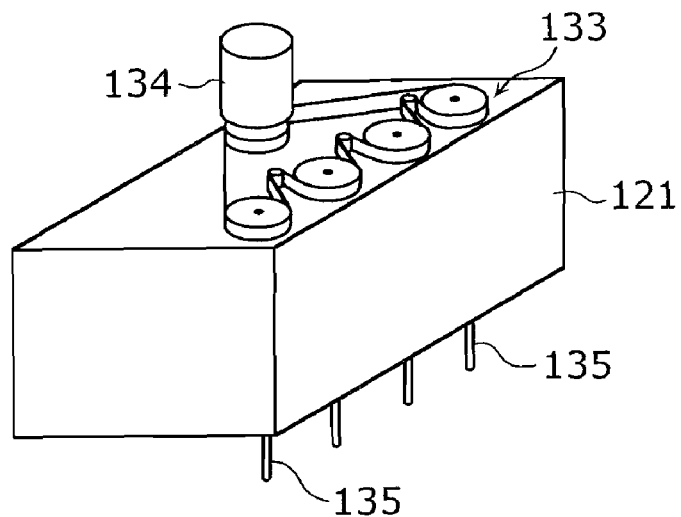
FIG. 24 is a perspective view of a line gang pickup head.

FIG. 24 is a perspective view of the line gang pickup head 121. The line gang pickup head 121 has four pickup nozzles 135 for picking up components and mounting the components onto the board 20. The four pickup nozzles 135 are connected to a drive system 133. The drive system 133 is driven by one servo motor 134. Thus, the four pickup nozzles 135 are rotated simultaneously by the same angle. At the time of component mounting, the operation of rotating a component in order to allow the component to be mounted at a mounting angle θi defined in the mounting point data 307a and then mounting the component onto the board 20 is repeated for each pickup nozzle 135. As described above, the four pickup nozzles 135 are rotated simultaneously by the same angle. Thus, when the mounting angles of the components picked up by the four pickup nozzles 135 are equal to each other, the rotating operation for the components picked up by the four pickup nozzles 135 can be performed at once. That is, at the time that the first component is mounted, the four pickup nozzles 135 are rotated simultaneously. Then, at the time that the second to the fourth components are to be mounted, the components have already been rotated into the desired mounting angle. Thus, these components need not be rotated at the time of mounting of these components. This permits mounting operation at a high speed.

When a task composed of components of the same mounting angles is assigned to the line gang pickup head 121 on the rear side where the distance from the component supply unit 125b to the board 20 is longer, the operating times of the line gang pickup heads 121 can approximately be equalized for the rear side and the front side.

Figure 25:
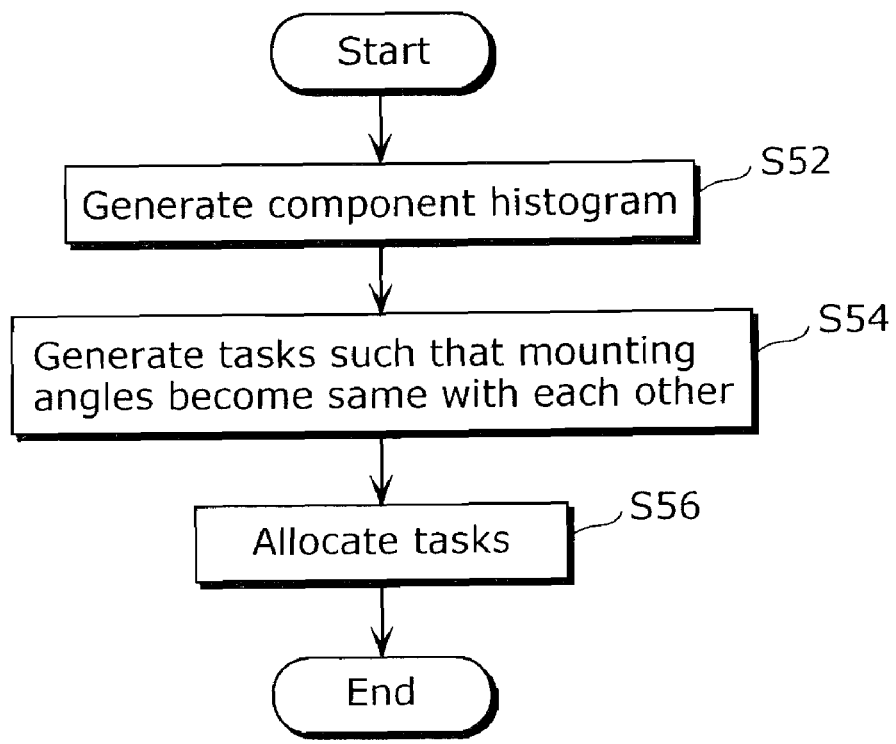
FIG. 25 is a flow chart of processing of generating tasks such that the mounting angles at the time of component mounting are equalized with priority to a line gang pickup head on the rear side.
Figures 26A, 26B, 26C, 26D:
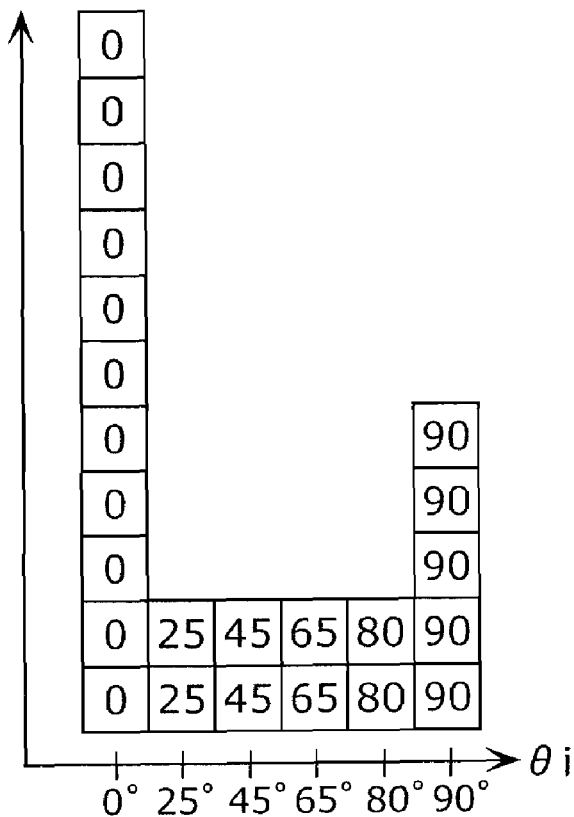
FIG. 26A is a diagram showing an example of a component histogram in which the horizontal axis indicates the mounting angle and the vertical axis indicates the number of mounting points for the component.
FIG. 26B is a diagram showing an example of tasks generated in accordance with the histogram shown in FIG. 26A.
FIG. 26C is a diagram showing an example of tasks for the rear side.
FIG. 26D is a diagram showing an example of tasks for the front side.

FIG. 25 is a flow chart of the processing of generating tasks for the rear side and the front side. The component mounting condition determining unit 305a of the component mounting condition determining apparatus 300 generates a component histogram based on the mounting point data 307a (S52). That is, as shown in FIG. 26A, a component histogram is generated in which the horizontal axis indicates the mounting angle θi while the vertical axis indicates the number of mounting points for the components. One block indicates one component, while numeric characters in each block indicate a mounting angle. As seen from the histogram in FIG. 26A, for example, the number of mounting points for the components having a mounting angle of 90° is five.

Then, the component mounting condition determining unit 305a generates tasks such that the mounting angles become equal to each other as much as possible (S54). That is, the components having the mounting angles where the number of mounting points is greatest, four components are extracted at a time so that tasks are generated. For example, the number of mounting points for the components having a mounting angle of 0° is 11. Thus, as shown in FIG. 26B, two tasks can be generated that contain only components having the mounting angle of 0°. Similarly, the number of mounting points for the components having a mounting angle of 90° is five. Thus, one task can be generated that contains only components having the mounting angle of 90°. The component mounting condition determining unit 305a selects components from the remaining components in such a manner that (the number of kinds of) the mounting angle becomes small as much as possible, such as to generates tasks sequentially. As a result of this processing, as shown in FIG. 26B, three tasks that contain components having the same angle and three tasks that contain components having the two kinds of mounting angles are generated.

Then, the component mounting condition determining unit 305a allocates the generated tasks to the front side and the rear side. That is, the component mounting condition determining unit 305a allocates tasks having the same mounting angle to the rear side with priority. For example, three tasks in which all mounting angles within each task are the same as shown in FIG. 26C are assigned to the rear side, while the remaining tasks shown in FIG. 26D are assigned to the front side. Here, when the number of tasks is even, it is sufficient that the tasks are allocated equally to the rear side and the front side. However, when the number of tasks is odd, task allocation may be performed such that the number of tasks for the front side is greater by one. The reason why that the number of tasks for the front side is set greater by one is that as described above, when the first task is assigned to the front side, this assignment reduces the distance that the line gang pickup head 121 moves in the first task, and hence permits component mounting to start immediately.

When the tasks are determined as described here, the operating times of the line gang pickup heads 121 can be approximately equalized for the rear side and the front side.

Here, in this modification, it is assumed that the components are rotated at the time of component mounting onto the board 20. However, the situation is similar even in a case where the components are picked up after the rotation of the pickup nozzles 135 so as to rotate the mounting angles before the components are recognized in order to prevent displacement of the picked up components caused by the rotation of the pickup nozzles 135 after the components picked up by the pickup nozzles 135 are recognized by the component recognizing camera 126. That is, when the rotation angles of the pickup nozzles 135 at the time of component pickup are not the same, the pickup nozzles 135 need be rotated at the time of picking up each component. This increases the time for component pickup. Further, since the pickup nozzles 135 need be rotated at the time of picking up each component, for example, even when the sequence of component types is common to the component cassettes and the pickup nozzles, the components cannot be picked up simultaneously. This increases further the time for component pickup. In contrast, in a case where the rotation angles of the pickup nozzles 135 at the time of component pickup are the same, when the pickup nozzle 135 is rotated once, the pickup nozzles 135 need not be rotated for other components within the same task. Further, when the sequence of component types is common to the component cassettes and the pickup nozzles, the components can be picked up simultaneously. This permits component pickup at a high speed. Thus, when a task that contains components having the same rotation angles of the pickup nozzles 135 at the time of component pickup is assigned to the rear side with priority, the operating times of the line gang pickup heads 121 can approximately be equalized for the rear side and the front side.

(Modification 2)

In Modification 2, tasks and a component mounting order are generated so as to reduce the component mounting time of the line gang pickup head 121 on the rear side, that is, a line gang pickup head 121 provided in a piece of sub-equipment having the longer distance from the component supply unit 125a to the board 20.

Figure 27:
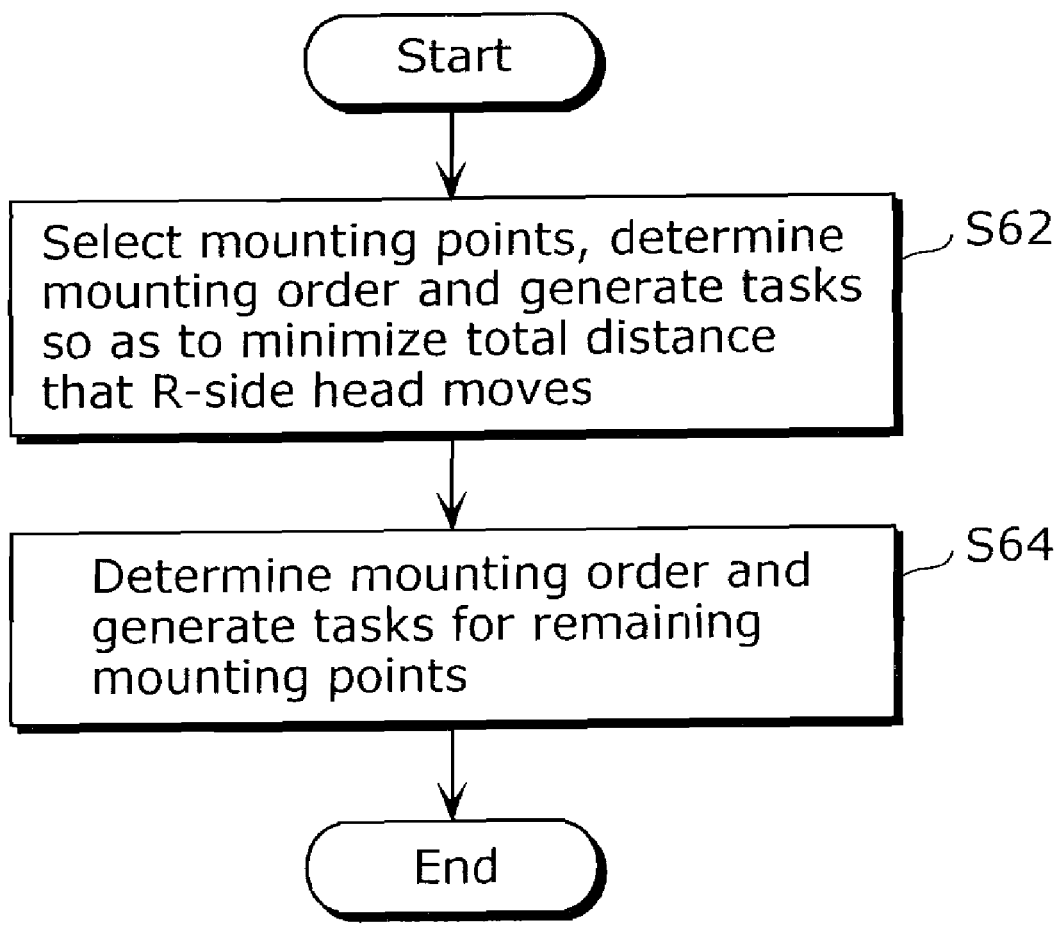
FIG. 27 is a flow chart of processing of generating a task that minimizes the total distance that a line gang pickup head on the rear side moves between the mounting points.

FIG. 27 is a flow chart of the processing of generating tasks for the rear side and the front side and determining a component mounting order.

Based on the mounting point data 307a, the component mounting condition determining unit 305a of the component mounting condition determining apparatus 300 selects mounting points such as to minimize the total distance that the rear head moves, and determines a mounting order so as to generate tasks (S62). Here, the number of components to be mounted by the line gang pickup head 121 on the rear side is determined by the following expression. That is, when the number of mounting points per board is denoted by n, the number of pickup nozzles of the line gang pickup head 121 on the front side is denoted by NF, the number of pickup nozzles of the line gang pickup head 121 on the rear side is denoted by NR, the number of tasks for the front side is denoted by TF, the number of tasks for the rear side is denoted by TR, the number of mounting points for the components to be mounted by the line gang pickup head 121 on the front side is denoted by CF, and the number of mounting points for the components to be mounted by the line gang pickup head 121 on the rear side is denoted by CR, the following relational expressions hold.

$$TF = \text{ROUNDUP}(n/(NF+NR))$$

$$CF = NF \times TF$$

$$TR = \text{ROUNDUP}((n-CF)/NR)$$

$$CR = n - CF$$

Here, ROUNDUP( ) is a function that rounds up a quantity below the decimal point so as to make the value into an integer.

In accordance with the above-mentioned formula, when the total number of tasks is even, the numbers of tasks can be equalized for the rear side and the front side. Further, when the total number of tasks is odd, the number of tasks for the front side can be set greater by one than the number of tasks for the rear side.

Further, in the line gang pickup head 121 on the front side, component mounting can be performed in a state that all pickup nozzles necessarily pick up components. Further, in the line gang pickup head 121 on the rear side, in some tasks, it is possible that some pickup nozzles do not pick up components.

Figure 28A:
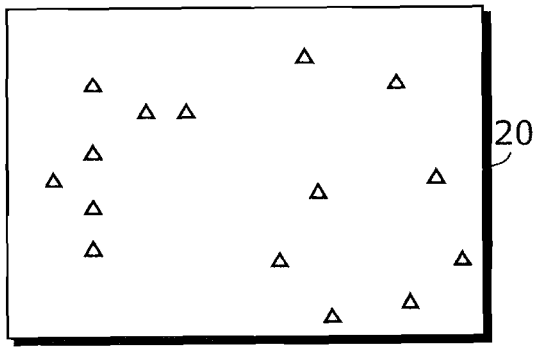
FIG. 28A is a diagram showing positions of mounting points on a board.

For example, it is assumed that 15 mounting points are present on one board 20 as indicated by triangles in FIG. 28A and that NF=4 and NR=4, the following relational expressions hold.

$$TF = \text{ROUNDUP}(15-(4+4))=2$$

$$CF = 4 \times 2 = 8$$

$$TR = \text{ROUNDUP}((15-8)/4)=2$$

$$CR = 15-8 = 7$$

Figure 28B:
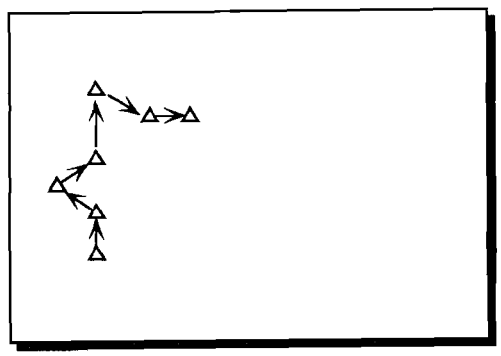
FIG. 28B is a diagram showing an example of a component mounting order used by a line gang pickup head on the rear side.

Since the number of mounting points CR for the components to be mounted by the line gang pickup head 121 on the rear side is 7, the component mounting condition determining unit 305a selects seven mounting points from the 15 mounting points shown in FIG. 28A such as to minimize the distance to move, and determines a mounting order. In the selection of the mounting points and the determination of the mounting order, for example, it is sufficient that the selection of the mounting points and the determination of the mounting order are performed such as to minimize the sum of the distances to move between the mounting points by using a greedy algorithm or a traveling salesman problem. Here, the selection method for the mounting points and the determination method for the mounting order are not limited to these methods. That is, other methods may be employed. FIG. 28B is a diagram showing the selected seven mounting points and their mounting order which are indicated by triangles and arrows.

Figure 28C:
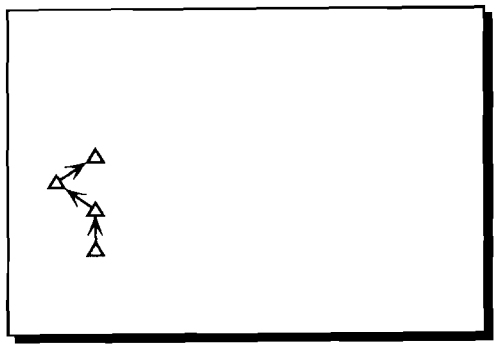
FIG. 28C is a diagram showing an example of a first task and a component mounting order used by a line gang pickup head on the rear side.
Figure 28D:
FIG. 28D is a diagram showing an example of a second task and a component mounting order used by a line gang pickup head on the rear side.

The component mounting condition determining unit 305a generates tasks based on the selected mounting points and the determined mounting order. That is, mounting points are selected sequentially in the order of mounting, so that tasks are generated. FIGS. 28C and 28D are diagrams showing the generated two tasks. As shown in FIG. 28C, the first task for the rear side is composed of the four mounting points that start in the order of mounting. Then, as shown in FIG. 28D, the second task for the rear side is composed of the three mounting points that follow in the order of mounting. Here, the execution sequence of the tasks may be reversed. That is, the second task may be executed first, and then the first task may be executed.

As for the remaining mounting points the mounting order of which is not yet determined, the component mounting condition determining unit 305a determines a mounting order such as to minimize the sum of the distances to move between the mounting points, and generates tasks (S64). As the determining method for the mounting order, a greedy algorithm or a traveling salesman problem may be employed as described above. The task generating method is also the same as that of the processing in S62.

Figure 28E:
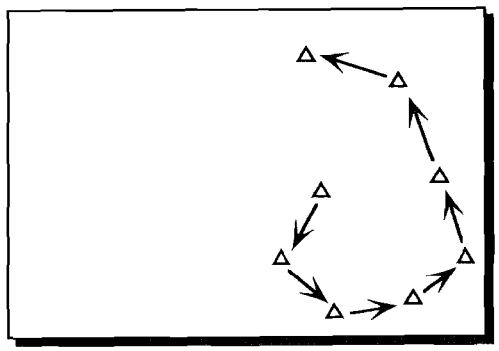
FIG. 28E is a diagram showing an example of a component mounting order used by a line gang pickup head on the front side.
Figure 28F:
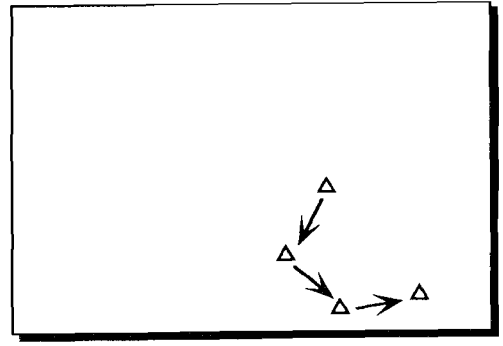
FIG. 28F is a diagram showing an example of a first task and a component mounting order used by a line gang pickup head on the front side.
Figure 28G:
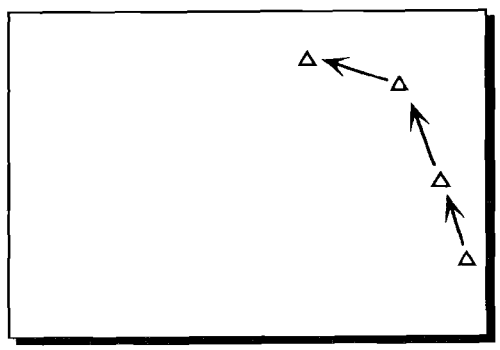
FIG. 28G is a diagram showing an example of a second task and a component mounting order used by a line gang pickup head on the front side.

FIG. 28E is a diagram showing the remaining eight mounting points and their mounting order which are indicated by triangles and arrows. FIGS. 28F and 28G are diagrams showing the generated two tasks. As shown in FIG. 28F, the first task for the front side is composed of the four mounting points that start in the order of mounting. Then, as shown in FIG. 28G, the second task for the front side is composed of the four mounting points that follow in the order of mounting. Here, the execution sequence of the tasks may be reversed.

As described above, according to Modification 2, the tasks are generated such as to reduce the sum of the distance that the line gang pickup head having the longer distance to move from the component supply unit to the board to move between the mounting points. Thus, the mounting time for the components can be further reduced for the line gang pickup head that has the longer distance to move from the component supply unit to the board. Accordingly, the operating times of the line gang pickup heads can approximately be equalized for the front side and the rear side.

(Modification 3)

In Modification 2, in the determination of a component mounting order, the component mounting order has been determined such as to minimize the movement path between the mounting points for each line gang pickup head 121. In contrast, in Modification 3, a component mounting order is determined such as to minimize the movement path between the mounting points for each task.

Figure 29:
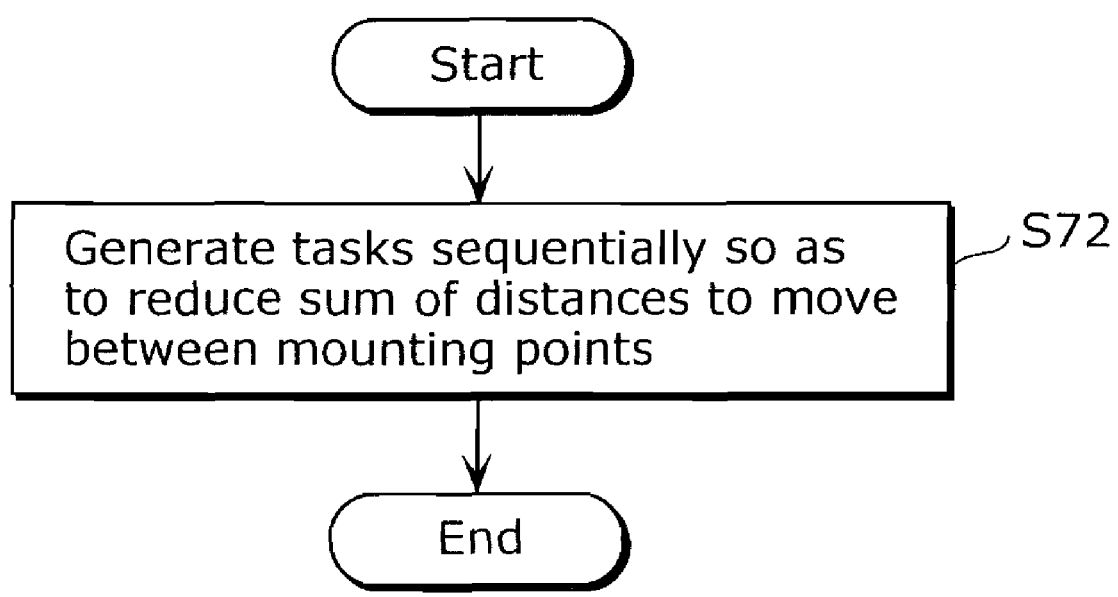
FIG. 29 is a flow chart of processing of generating a task that minimizes the total distance that a line gang pickup head on the rear side moves between the mounting points.

FIG. 29 is a flow chart of the processing of generating tasks for the rear side and the front side and determining a component mounting order.

Based on the mounting point data 307a, the component mounting condition determining unit 305a of the component mounting condition determining apparatus 300 generates tasks sequentially such as to minimize the sum of the distances to move between the mounting points in each task (S72). This task generating method is described below with reference to a detailed example.

The number TF of tasks for the front side, the number CF of mounting points for the components to be mounted by the line gang pickup head 121 on the front side, the number TR of tasks for the rear side, and the number CR of mounting points for the components to be mounted by the line gang pickup head 121 on the rear side are acquired similarly to Modification 2. That is, as shown in FIG. 28A, in a case where 15 mounting points are present on one board 20 and where the number NF of pickup nozzles of the line gang pickup head 121 on the front side and the number NR of pickup nozzles of the line gang pickup head 121 on the rear side are both 4, TF=2, CF=8, TR=2 and CR=7 are obtained.

Further, the numbers of mounting points contained in the two tasks for the rear side are 4 and 3 similarly to Modification 2. Thus, the component mounting condition determining unit 305a selects four mounting points from the 15 mounting points and determines a mounting order such as to minimize the distance to move, and generates the first task for the rear side. Then, the component mounting condition determining unit 305a selects three mounting points from the remaining eleven mounting points where a mounting order is not yet determined, such as to minimize the distance to move, and determines a mounting order so as to generate the second task for the rear side. The selection method for the mounting points and the determination method for the mounting order are similar to those of Modification 2. Here, the execution sequence of the tasks may be reversed. Furthermore, when the first task has been determined, four mounting points have been selected. However, three mounting points may be selected.

Figure 30A:
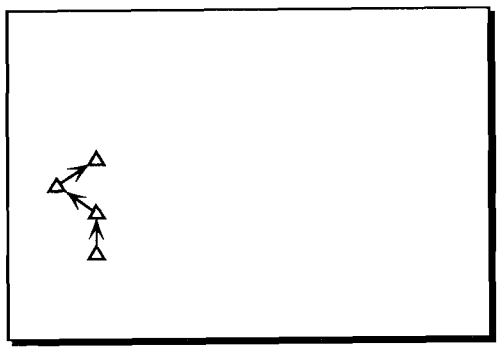
FIG. 30A is a diagram showing an example of a first task and a component mounting order used by a line gang pickup head on the rear side.
Figure 30B:
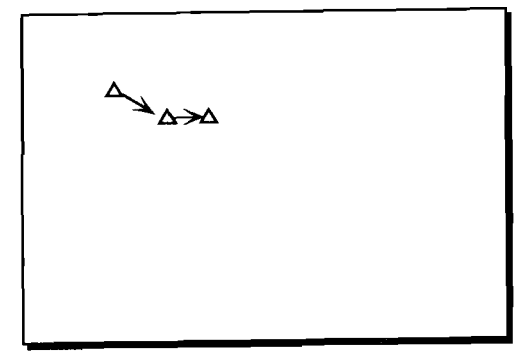
FIG. 30B is a diagram showing an example of a second task and a component mounting order used by a line gang pickup head on the rear side.

FIGS. 30A and 30B are diagrams showing configurations of the first and the second tasks for the rear side determined as described above. Triangles indicate mounting points, while arrows indicate a mounting order.

Similarly, the component mounting condition determining unit 305*a* selects four mounting points from the remaining eight mounting points and determines a mounting order such as to minimize the distance to move, and generates the first task for the front side. Finally, for the remaining four mounting points, the component mounting condition determining unit 305*a* determines a mounting order such as to minimize the distance to move, and generates the second task for the rear side. The selection method for the mounting points and the determination method for the mounting order are similar to those of Modification 2. Here, the execution sequence of the tasks may be reversed.

Figure 30C:
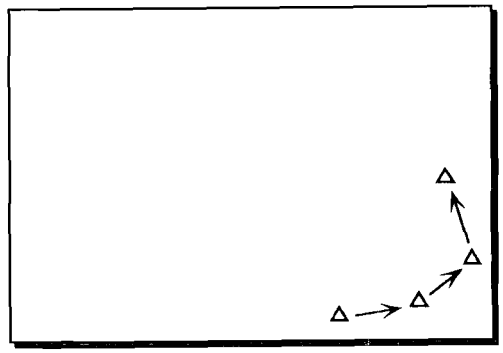
FIG. 30C is a diagram showing an example of a first task and a component mounting order used by a line gang pickup head on the front side.
Figure 30D:
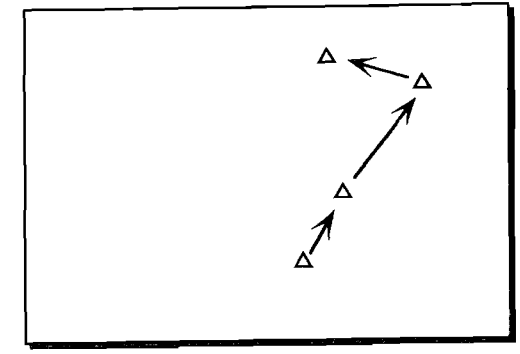
FIG. 30D is a diagram showing an example of a second task and a component mounting order used by a line gang pickup head on the front side.

FIGS. 30C and 30D are diagrams showing configurations of the first and the second tasks for the front side determined as described above. Triangles indicate mounting points, while arrows indicate a mounting order. As seen from the figure, the sum of the distances to move between the mounting points is longer than that of the tasks for the rear side shown in FIGS. 30A and 30B.

As described above, according to Modification 3, the tasks are generated such as to reduce the sum of the distances to move between the mounting points for the line gang pickup head having the longer distance to move from the component supply unit to the board. Thus, the mounting time for the components can be further reduced in a line gang pickup head that has the longer distance to move from the component supply unit to the board. Accordingly, the operating times of the line gang pickup heads can approximately be equalized for the front side and the rear side.

The embodiments disclosed in the present specification are to be considered as illustrative and not restrictive at all points. The scope of the present invention is defined not by the above-mentioned description but by the claims, and includes all equivalents to the scope of the claims and all modifications within the scope.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a component mounting condition determining method of determining a mounting condition for a component mounter that produces a circuit board and, in particular, to a component mounting condition determining method or the like of determining a mounting condition for a component mounter of so-called alternate mounting.

The invention claimed is:

1. A component mounting condition determining method performed by a computer including a central processing unit and a memory, said component mounting condition determined method for determining a component mounting condition used for a component mounter which includes a plurality of mounting heads that are located on opposite sides of a pair of rails for transporting a board and that alternately mount components onto the board, wherein the pair of rails includes a fixed rail and a movable rail, and said component mounting condition determining method comprising:

calculating a movement distance by which each of the mounting heads moves between a component supply unit that supplies the components and the board, based on a length of the board in a Y-axis direction perpendicular to a transportation direction of the board or a position of the movable rail in the Y-axis direction; and determining a component mounting condition so as to (i) approximately equalize operating times of the mounting heads by reducing a partial operating time of a first of the mounting heads which is determined, in said calculating, to move a longer distance between the component supply unit and the board than a second of the mounting heads, and (ii) assign a first task to the second mounting head, which is determined, in said calculating, to move a shortest distance between the component supply unit and the board, the partial operating time to be reduced being time that the first mounting head takes for an operation other than movement of the first mounting head between the component supply unit and the board, and the first task being a task of a plurality of tasks that is assigned first, each of the tasks being defined as an iteration of sequential operations of pickup, movement, and mounting of a component performed by a corresponding one of the mounting heads.

2. The component mounting condition determining method according to claim 1, wherein in said determining, the component mounting condition is determined so as to reduce a length of time necessary for the first mounting head which moves the longer distance between the component supply unit and the board to pick up the components from the component supply unit.

3. The component mounting condition determining method according to claim 1, wherein in said determining, the component mounting condition is determined so as to increase a number of components which can be simultaneously picked up from the component supply unit by the first mounting head which moves the longer distance between the component supply unit and the board.

4. The component mounting condition determining method according to claim 1, wherein in said determining, the component mounting condition is determined so as to reduce a number of the tasks performed by the first mounting head which moves the longer distance between the supply unit and the board.

5. The component mounting condition determining method according to claim 1, wherein in said determining, the component mounting condition is determined so as to reduce a number of pickup nozzles of the first mounting head which moves the longer distance between the component supply unit and the board that is used, the pickup nozzles, of the mounting heads, being used for picking up the components.

6. The component mounting condition determining method according to claim 1, wherein in said determining, a side where the first mounting head moves the longer distance between the component supply unit and the board is a side where the movable rail is located, while another side where the second mounting head moves a shorter distance between the component supply unit and the board is a side where the fixed rail is located.

7. The component mounting condition determining method according to claim 6, wherein in said determining, in response to movement of the movable rail, the component mounting condition is determined again so as to approximately equalize the operating times among the mounting heads.

8. A component mounting method performed by a plurality of mounting heads that are located on opposite sides of a pair of rails for transporting a board and that alternately mount components onto the board, wherein the pair of rails includes a fixed rail and a movable rail, said component mounting method comprising:

calculating a movement distance by which each of the mounting heads moves between a component supply unit that supplies the components and the board, based on a length of the board in a Y-axis direction perpendicular to a transportation direction of the board or a position of the movable rail in the Y-axis direction;

determining a component mounting condition so as to (i) approximately equalize operating times of the mounting heads by reducing a partial operating time of a first of the mounting heads which is determined, in said calculating, to move a longer distance between the component supply unit and the board than a second of the mounting heads, and (ii) assign a first task to the second mounting head, which is determined, in said calculating, to move a shortest distance between the component supply unit and the board, the partial operating time to be reduced being time that the first mounting head takes for an operation other than movement of the first mounting head between the component supply unit and the board, and the first task being a task of a plurality of tasks that is assigned first, each of the tasks being defined as an iteration of sequential operations of pickup, movement, and mounting of a component performed by a corresponding one of the mounting heads; and mounting the components onto the board under the component mounting condition determined in said determining.

* * * * *